(12) United States Patent
Fujisawa et al.

(10) Patent No.: US 8,630,129 B2
(45) Date of Patent: Jan. 14, 2014

(54) SEMICONDUCTOR DEVICE HAVING PLURAL BANKS

(75) Inventors: Hiroki Fujisawa, Tokyo (JP); Yuuji Motoyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 112 days.

(21) Appl. No.: 13/304,062

(22) Filed: Nov. 23, 2011

(65) Prior Publication Data

US 2012/0134217 A1 May 31, 2012

(30) Foreign Application Priority Data

Nov. 26, 2010 (JP) ................................. 2010-264147

(51) Int. Cl.
*G11C 7/10* (2006.01)
(52) U.S. Cl.
USPC ................................................... 365/189.05
(58) Field of Classification Search
USPC ................................................... 365/189.05
See application file for complete search history.

(56) References Cited

U.S. PATENT DOCUMENTS

| 7,719,922 | B2 | 5/2010 | Fujisawa |
| 2002/0149990 | A1* | 10/2002 | Lee .......................... 365/230.03 |
| 2002/0174313 | A1* | 11/2002 | Kuhn ............................ 711/167 |
| 2009/0010091 | A1 | 1/2009 | Fujisawa |
| 2010/0070676 | A1* | 3/2010 | Ryu .................................. 711/5 |
| 2011/0205828 | A1* | 8/2011 | Richter et al. ........... 365/230.03 |

FOREIGN PATENT DOCUMENTS

JP 2009-015953 A 1/2009

* cited by examiner

*Primary Examiner* — Hoai V Ho
*Assistant Examiner* — Min Huang
(74) *Attorney, Agent, or Firm* — McGinn IP Law Group, PLLC

(57) ABSTRACT

A semiconductor device is provided with a control circuit generating a plurality of first control signals indicating timings at which column switches conduct at the time of reading and a plurality of second control signals indicating timings at which the column switches conduct at the time of writing. The control circuit activates the plurality of first control signals such that timing at which the data read from each of memory cell arrays arrives at a FIFO circuit after reception of a read instruction from outside is the same in each bank and activates the plurality of second control signals such that the column switches match a timing at which write data input from outside to a first data input/output terminal arrives at the corresponding column switch.

19 Claims, 15 Drawing Sheets

SEMICONDUCTOR DEVICE HAVING PLURAL BANKS

BACKGROUND OF THE INVENTION

1. Field of the Invention

The present invention relates to a semiconductor device, and particularly to a semiconductor device including a memory cell array having a plurality of banks.

2. Description of Related Art

In a Double Data Rate 3 (DDR3) type Synchronous Dynamic Random Access Memory (SDRAM) having eight banks, eight banks BA0 to BA7 are arranged in two lines with four banks in each line, for example. The banks are intended to mean a plurality of memory areas having non-exclusive control relationship with one another. The banks are arranged in the order of the banks BA0, BA1, BA4, and BA5 in a first line and in the order of the banks BA2, BA3, BA6, and BA7 in a second line from one end (upper left end) to the other end (lower right end) of a chip. A data input/output terminal is arranged as an interface shared by the eight banks in an area between the lines (hereinafter, referred to as a "wiring area").

Each of the banks BA0 to BA7 and the data input/output terminal are connected by a predetermined number of the read/write buses. As an example, when the number of data input/output terminals is eight, the number of prefetches is eight, and a burst length=4, the number of read/write buses required for each bank is obtained as 8×8/(8/4)=32. Hereinafter, description will be given on the assumption of this example.

Each of the 32 read/write buses for each bank is extracted from a main amplifier in the corresponding bank to the wiring area and wired to the data input/output terminal through a Y11 multiplexer related to Y11 being a part of a column address and a First In First Out (FIFO) circuit while joining with the read/write bus from another bank. Herein, the Y11 multiplexer is a circuit for realizing switching between ×4 operation (operation to input and output data using only four data input/output terminals) and ×8 operation (operation to input and output the data using all eight data input/output terminals). Also, the FIFO circuit realizes burst input/output.

When a connection relationship is specifically described, each group of the 32 read/write buses, extracted from each of the banks BA0, BA2, BA5, and BA7 located on furthest ends (upper left, lower left, upper right, and lower right) of the chip to the wiring area, extends in the wiring area in a chip longitudinal direction (x-direction) toward the center of the chip. Each group of the 32 read/write buses, extracted from each of the banks BA1, BA3, BA4, and BA6 located so as to be closer to the center of the chip (upper left, lower left, upper right, and lower right) in the wiring area, joins with the read/write buses extracted from the bank on the furthest end adjacent to the same in the wiring area. Each read/write bus thus extracted in the vicinity of the center of the chip is connected to the Y11 multiplexer in the vicinity of the center of the chip.

Four read/write buses are connected to each of the eight data input/output terminals. Thirty-two FIFO circuits for the read/write buses are provided and ends on a side of the Y11 multiplexer of the thirty-two FIFO circuits are connected to four Y11 multiplexers through the four read/write buses.

Japanese Patent Application Laid-Open No. 2009-015953 discloses a circuit configuration of the DDR3 type SDRAM in detail.

However, the read/write bus configured as described above has a problem in that high-speed operation cannot be performed. This is because a wiring length of the read/write bus increases to be substantially half a length of a longitudinal side (x-direction) of the chip for the four banks BA0, BA2, BA5, and BA7 located on the furthest ends of the chip, so that a load (parasitic capacitance of the read/write bus) increases and a signal waveform is rounded.

On the other hand, it is possible to inhibit the rounding of the signal waveform by inserting an intermediate buffer between the banks BA0 and BA1, between the banks BA2 and BA3, between the banks BA5 and BA4, and between the banks BA7 and BA6. However, the number of stages of the intermediate buffer is different for each bank as seen from the data input/output terminal with such a configuration, so that skew is generated between the banks on the basis of the FIFO circuit at the time of reading, for example. Especially, this is the skew of the data between the banks, which share the read/write bus. For example, time required for a plurality of data corresponding to a bank 0 and a bank 1 to arrive at the FIFO circuit is different, and this is the skew indicating the plurality of data. Therefore, although the rounding of the signal waveform may be inhibited, the high-speed operation cannot be realized after all.

SUMMARY

In one embodiment, there is provided with a semiconductor device that includes: first and second banks arranged so as to be opposed to each other in a first direction; third and fourth banks arranged so as to be adjacent to the first and second banks, respectively, in a second direction substantially perpendicular to the first direction, the third and fourth banks being arranged so as to be opposed to each other in the first direction; fifth and sixth banks arranged so as to be adjacent to the third and fourth banks, respectively, in the second direction, the third and fourth banks being sandwiched in between the first and second banks and the fifth and sixth banks, respectively, the fifth and sixth banks being arranged so as to be opposed to each other in the first direction; first to sixth memory cell arrays provided in the first to sixth banks, respectively; a first read/write bus connected to both of the first and second memory cell arrays, the first read/write bus extending in an area between the first and second banks in the second direction; a second read/write bus connected to both of the third and fourth memory cell arrays, the second read/write bus extending in an area between the third and fourth banks in the second direction; a third read/write bus connected to both of the fifth and sixth memory cell arrays, the third read/write bus extending in an area between the fifth and sixth banks in the second direction; first and second column switches constituting a first group, the first and second column switches corresponding to the first and second memory cell arrays, respectively, each of the first and second column switches inputting and outputting a plurality of data stored in a plurality of memory cells in the corresponding memory cell array to and from the first read/write bus; third and fourth column switches constituting a second group, the third and fourth column switches corresponding to the third and fourth memory cell arrays, respectively, each of the third and fourth column switches inputting and outputting plurality of data stored in a plurality of memory cells in the corresponding memory cell array to and from the second read/write bus; fifth and sixth column switches constituting a third group, the fifth and sixth column switches corresponding to the fifth and sixth memory cell arrays, respectively, each of the fifth and sixth column switches inputting and outputting a plurality of data stored in a plurality of memory cells in the corresponding memory cell array to and from the third read/write bus; a first intermediate buffer connecting the first read/write bus and the second read/write bus; a second intermediate buffer connecting the second read/write bus and the third read/write bus; a first data input/output terminal being an interface with outside related to the data; a first FIFO circuit inputting and outputting the data between the first read/write bus and the first data input/output terminal; and a control circuit generating a plurality of first control signals and a plurality of second control signals, the plurality of first control signals indicating timings at which the first to sixth column switches are allowed to electrically conduct during a read operation, the plurality of second control signals indicating timings at which the first to sixth column switches are allowed to electrically conduct during a write operation, wherein the control circuit activates the plurality of first control signals at different times in units of the first to third groups such that times indicating timings at which a plurality of read data read from the first to sixth memory cell arrays arrive at the first FIFO circuit are substantially the same in the first to sixth banks during a read operation, and the control circuit activates the plurality of second control signals at different times in units of the first to third groups such that the first to sixth column switches are allowed to electrically conduct so as to substantially match timings at which the write data supplied from outside to the first data input/output terminal arrives at the corresponding column switch during a write operation.

BRIEF DESCRIPTION OF THE DRAWINGS

FIGS. 7A and 7B are views indicative of an embodiment of a table of truth value of each signal;

DETAILED DESCRIPTION OF THE EMBODIMENTS

Figure 1:
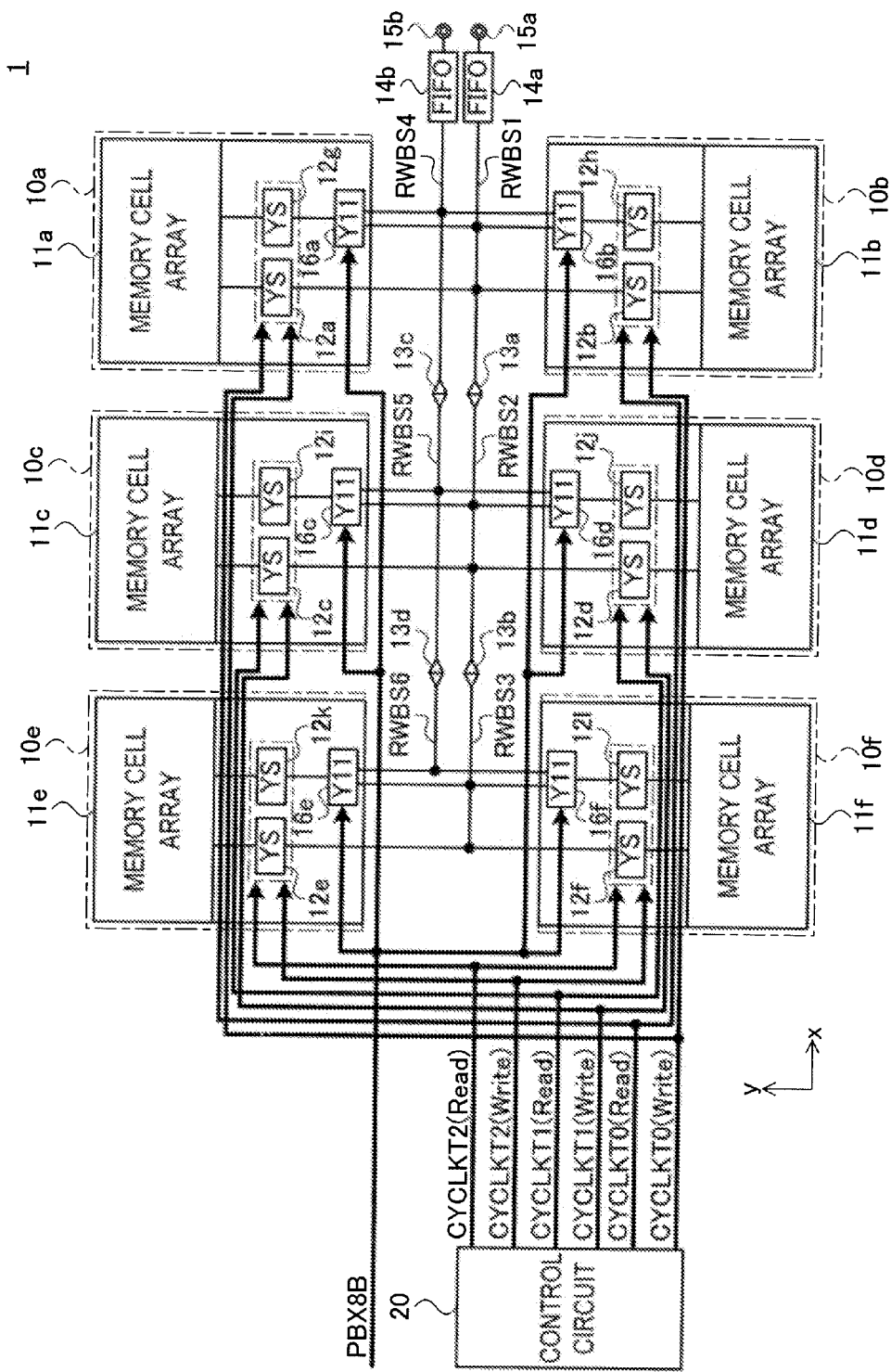
FIG. 1 is an explanatory schematic diagram of an embodiment of the present invention.

Referring now to FIG. 1, a semiconductor device 1 according to an embodiment of the present invention is provided with banks 10a to 10f (first to sixth banks). The banks 10a and 10b are arranged so as be opposed to each other in the y-direction (first direction) to sandwich an area between the lines (first wiring area). The banks 10a and 10b share a first read/write bus arranged in the first wiring area. The first read/write bus is a signal line bidirectionally transferring read data and write data in association with the time of reading and the time of writing, respectively. Also, the banks 10c and 10d are arranged so as to be adjacent to the banks 10a and 10b, respectively, in the x-direction (second direction perpendicular to the first direction) and are arranged so as be opposed to each other in the y-direction to sandwich an area between the lines (second wiring area). The banks 10c and 10d share a second read/write bus arranged in the second wiring area. The banks 10e and 10f are arranged so as to be adjacent to the banks 10c and 10d, respectively, in the x-direction, and are arranged so as be opposed to each other in the y-direction to sandwich the area between the lines (third wiring area). The banks 10c and 10d share a third read/write bus arranged in the third wiring area.

Corresponding memory cell arrays 11a to 11f (first to sixth memory cell arrays) are arranged in the banks 10a to 10f, respectively.

Six read/write buses RWBS1 to RWBS6 (first to sixth read/write buses) are provided in the areas (first to third wiring areas) between the banks in the y-direction. Among them, the read/write buses RWBS1 and RWBS4 are connected to both of the memory cell arrays 11a and 11b and extends in the area between the banks 10a and 10b in the x-direction. The read/write buses RWBS2 and RWBS5 are connected to both of the memory cell arrays 11c and 11d and extends in the area between the banks 10c and 10d in the x-direction. The read/write buses RWBS3 and RWBS6 are connected to both of the memory cell arrays 11e and 11f and extends in the area between the banks 10e and 10f in the x-direction. Therefore, since the opposed banks use one set of read/write buses, the number of data lines in the wiring area may be reduced.

A column switch 12a (first column switch), a column switch 12g (seventh column switch), and a Y11 multiplexer 16a (first multiplexer) are arranged on positions closer to the wiring area in the bank 10a. The column switch 12a is a circuit inputting/outputting the data stored in the memory cell in the corresponding memory cell array 11a to/from the corresponding read/write bus RWBS1. Also, the column switch 12g is a circuit inputting/outputting the data stored in the memory cell in the corresponding memory cell array 11a to/from either of the two corresponding read/write buses RWBS1 and RWBS4.

The column switches 12a and 12g are distinguished from each other by a Y11 bit out of a plurality of bits included in a column address. Specifically, the column switch 12a corresponds to Y11=0 (/Y11) and the column switch 12g corresponds to Y11=1 (Y11). The data input/output through the column switch 12g (data read from the address corresponding to Y11=1) is output to the read/write bus RWBS4 when the semiconductor device 1 is allowed to perform ×8 operation and output to the read/write bus RWBS1 when the semiconductor device 1 is allowed to perform ×4 operation. Such switching operation is controlled by the Y11 multiplexer 16a provided between the column switch 12g and the read/write buses RWBS1 and RWBS4.

Operation of the Y11 multiplexer 16a is controlled by an operation mode signal PBX8B, which is set to be low when the semiconductor device 1 is allowed to perform the ×8 operation (first operation mode) and is set to be high when the semiconductor device 1 is allowed to perform the ×4 operation (second operation mode). When the operation mode signal PBX8B is set to be low (that is, in a case of the ×8 operation), the Y11 multiplexer 16a connects the column switch 12g to the read/write bus RWBS4. On the other hand, when the operation mode signal PBX8B is set to be high (that is, in a case of the ×4 operation), the Y11 multiplexer 16a connects the column switch 12g to the read/write bus RWBS1.

In the banks 10b to 10f also, as in the bank 10a, column switches 12b to 12f (second to sixth column switches), column switches 12h to 12l (eighth to twelfth column switches), and Y11 multiplexers 16b to 16f (second to sixth multiplexers) are arranged, respectively. Connection and function thereof are similar to those of the above-described column switches 12a and 12g and Y11 multiplexer 16a, so that they are not described in detail.

The read/write buses RWBS1 and RWBS2 are connected to each other by an intermediate buffer 13a (first intermediate buffer). Similarly, the read/write buses RWBS2 and RWBS3 are connected to each other by an intermediate buffer 13b (second intermediate buffer), the read/write buses RWBS4 and RWBS5 are connected to each other by an intermediate buffer 13c (third intermediate buffer), and the read/write buses RWBS5 and RWBS6 are connected to each other by an intermediate buffer 13d (fourth intermediate buffer). All of the intermediate buffers 13a to 13d are bidirectional three-state buffers and serve to shape a wave form of a signal when the signal is allowed to pass therethrough. The read/write bus RWBS1 is connected to a gate electrode of the three-state buffer and the read/write bus RWBS2 is connected to a drain electrode of the three-state buffer, so that even when the three-state buffer is activated, parasitic capacitances of the read write buses RWBS1 and RWBS2 do not couple to each other.

FIFO circuits 14a and 14b (first and second FIFO circuits) and corresponding data input/output terminals 15a and 15b (first and second data input/output terminals) are further provided in the wiring area. The FIFO circuit 14a inputs/outputs the data between the read/write bus RWBS1 and the data input/output terminal 15a. The FIFO circuit 14b inputs/outputs the data between the read/write bus RWBS4 and the data input/output terminal 15b.

In the semiconductor device 1, a length of the read/write bus is not excessive (the longest part is comparable to a length of one bank in the x-direction) by providing the intermediate buffers 13a to 13d. Therefore, the rounding of the signal waveform is inhibited. On the other hand, however, the number of stages of the intermediate buffer is different for each bank in the semiconductor device 1. Specifically, the number of stages of the intermediate buffer is 0 for the banks 10a and 10b, 1 for the banks 10c and 10d, and 2 for the banks 10e and 10f. Although the number of stages of the intermediate buffer is different for each bank in this manner, it is possible to realize the high-speed operation by a process of a control circuit 20 to be described later in the semiconductor device 1. This is hereinafter described in detail.

The semiconductor device 1 is provided with the control circuit 20 generating first control signals CYCLKT0(Read) to CYCLKT2(Read) indicating the timings at which the column switches 12a to 12l electrically conduct and second control signals CYCLKT0(Write) to CYCLKT2(Write) indicating the timings at which the column switches 12a to 12l electrically conduct. Meanwhile, it is herein configured that the first control signal CYCLKT0(Read) and the second control signal CYCLKT0 (Write) are input to the column switches 12a, 12b, 12g, and 12h, the first control signal CYCLKT1 (Read) and the second control signal CYCLKT1(Write) are input to the column switches 12c, 12d, 12i, and 12j, and the first control signal CYCLKT2(Read) and the second control signal CYCLKT2(Write) are input to the column switches 12e, 12f, 12k, and 12l, respectively.

The control circuit 20 activates the first control signals CYCLKT0(Read) to CYCLKT2 (Read) at the different times such that the time from the reception of the read instruction from outside (data reading instruction from each of the memory cell arrays 11a to 11f) to the timing at which a plurality of read data read from the memory cell arrays 11a to 11f arrive at the corresponding FIFO circuits 14a and 14b is the same in each of the banks. The control circuit 20 also activates the second control signals CYCLKT0(Write) to CYCLKT2(Write) at different times such that the column switches 12a to 12l conduct at the timings at which a plurality of write data supplied from outside to the data input/output terminals 15a and 15b arrive at the column switches 12a to 12l.

In order to realize the above-described activation of the column switches 12a to 12l at different times, the control circuit 20 performs a process to shift an activation timing of each control signal for each bank and for each operation mode. Specifically, a delay amount for each bank and for each operation mode is set in the control circuit 20 and the control circuit 20 performs the process of the activation timing of each control signal based on setting of the delay amount. The delay amount is determined based on the number of stages of the intermediate buffer provided on a data transmission path between the FIFO circuits 14a and 14b and each of the banks 10a to 10f.

The delay amount set in the control circuit 20 will be specifically described. In the following description, the delay amount of one stage of the intermediate buffer is set to T and the delay amount of the banks 10a and 10b with the number of stages=0 (delay amounts of the first control signal CYCLKT0(Read) and the second control signal CYCLKT0 (Write)) is set to X. First, at the time of reading, the delay amount of the first control signal CYCLKT1 (Read) related to the banks 10c and 10d with the number of stages=1 is set to X−T. On the other hand, the delay amount of the first control signal CYCLKT2 (Read) related to the banks 10e and 10f with the number of stages=2 is set to X−2T. At the time of writing, the delay amount of the second control signal CYCLKT1(Write) related to the banks 10c and 10d with the number of stages=1 is set to X+T. On the other hand, the delay amount of the second control signal CYCLKT2 (Write) related to the banks 10e and 10f with the number of stages=2 is set to X+2T.

By setting the above-described delay amounts in the control circuit 20, the time at which the data corresponding to the banks 10a to 10f arrive at the FIFO circuits 14a and 14b is the same in each of the banks at the time of reading, and the column switches 12a to 12l operate at an appropriate time for each bank (arrival time of the data input from the FIFO circuits 14a and 14b to the corresponding read/write bus) at the time of writing. Therefore, according to the semiconductor device 1, even though the number of stages of the intermediate buffer is different for each bank in order to inhibit the rounding of the signal waveform, the skew between the banks is inhibited, and it is possible to realize the high-speed operation.

Figure 2:
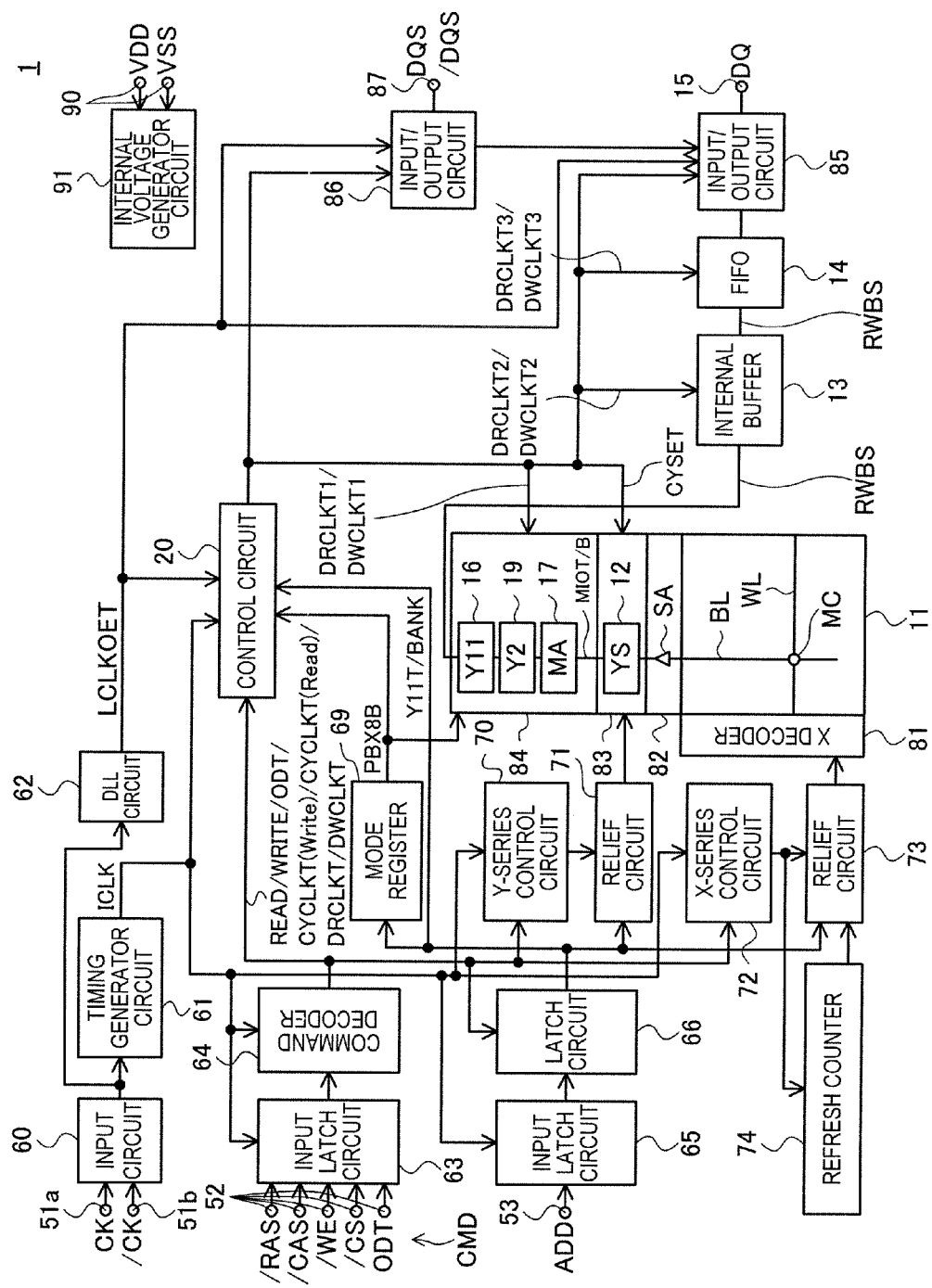
FIG. 2 is a block diagram indicative of an embodiment of a configuration of a semiconductor device 1.

Turning to FIG. 2, a synchronous semiconductor device 1 according to this embodiment is a DDR3-type SDRAM and is provided with, as external terminals, clock terminals 51a and 51b as terminals to which synchronous signals are supplied, a command terminal 52 as a terminal to which a read command and a write command are supplied, an address terminal 53 as a terminal to which information to determine the address of the memory cell, which is an access target, is supplied, a data input/output terminal 15 as a terminal reading the data in the memory cell to outside or writing external data to the memory cell, a data strobe terminal 87 as a terminal to synchronize the data of the data input/output terminal 15 with a controller controlling the semiconductor device 1, and a power supply terminal 90 as a terminal supplying power to the semiconductor device 1.

The clock terminals 51a and 51b are the terminals to which external clock signals CK and /CK are supplied, respectively, and the supplied external clock signals CK and /CK are supplied to a timing generator circuit 61 and a DLL circuit 62 through an input circuit 60. In this specification, a signal with "/" at the beginning of a signal name is intended to mean an inversion signal of a corresponding signal or a low active signal. Therefore, the external clock signals CK and /CK are complementary signals. The timing generator circuit 61 generates a single-phase internal clock signal ICLK based on the external clock signals CK and /CK and supplies the same to each circuit in the semiconductor device 1.

The DLL circuit 62 is a clock generator circuit receiving the external clock signals CK and /CK and generating an internal clock signal LCLKOET of which phase and duty are controlled with respect to the external clock signals CK and /CK. The generated internal clock signal LCLKOET is supplied to the control circuit 20 and input/output circuits 85 and 86 to be described later.

The command terminal 52 is the terminal to which various command signals CMD such as a row address strobe signal /RAS, a column address strobe signal /CAS, a write enable signal /WE, a chip select signal /CS, an on-die termination signal ODT are supplied. The command signals CMD are input to a command decoder 64 through an input latch circuit 63.

The command decoder 64 generates various internal commands from the input command signals CMD and supplies them to each circuit in the semiconductor device 1. The various internal commands generated herein include a read command READ indicating entry to a read mode, a write command WRITE indicating entry to a write mode, an on-die termination command ODT indicating on/off of the on-die termination, a control command CYCLKT(Read) (first control command) controlling operation of the column switch 12 (to be described later) at the time of reading, a control command CYCLKT(Write) (second control command) controlling the operation of the column switch 12 at the time of writing, a control command DRCLKT controlling an operation timing of a main amplifier 17 (to be described later), the intermediate buffer 13 (to be described later), and the FIFO circuit 14 (to be described later) at the time of reading, and a control command DWCLKT controlling the operation timing of the main amplifier 17, the intermediate buffer 13, and the FIFO circuit 14 at the time of writing.

The address terminal 53 is the terminal to which an address signal ADD is supplied, and the supplied address signal ADD is supplied to a latch circuit 66 through an input latch circuit 65. The address signal ADD includes row addresses X0 to X11, column addresses Y0 to Y9 and Y11, and a bank address BANK. The latch circuit 66 latches the address signal ADD supplied to the input latch circuit 65 and supplies the row addresses X0 to X11 and the bank address BANK to a relief circuit 73 and supplies the column addresses Y0 to Y9 and Y11 and the bank address BANK to a relief circuit 71, respectively. Also, the latch circuit 66 generates a Y11 selection signal Y11T, which is set to be high when the column address Y11 is "1" and set to be low when the column address Y11 is "0", and supplies the same to the control circuit 20 to be described later together with the bank address BANK.

When the semiconductor device 1 enters a mode register set, the address signal ADD is supplied to a mode register 69, and according to this, contents of the mode register 69 are updated. Information set in the mode register 69 includes the operation mode signal PBX8B related to the number of I/O (×4, ×8) described above. The operation mode signal PBX8B is taken out by the control circuit 20 to be described later.

Figure 5:
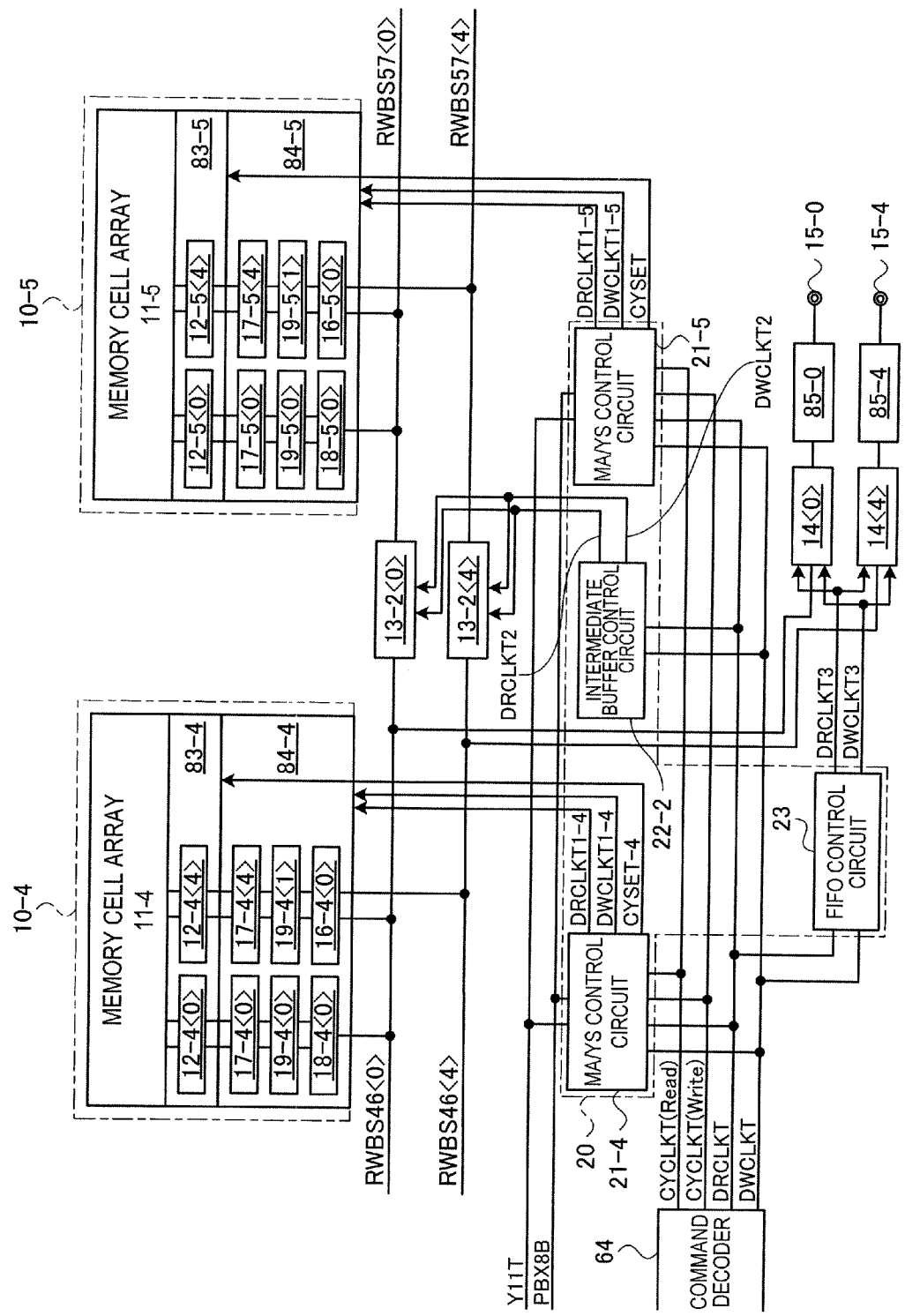
FIG. 5 is a view indicative of an embodiment of a configuration of the control circuit 20 shown in FIG. 2.

The row address and the column address are the addresses to determine the memory cell being the access target by specifying a word line WL and a bit line BL in the memory cell array 11. Also, the memory cell arrays 11 are divided into eight banks as described later, and the bank address BANK is the address to specify one of them. In the memory cell array 11, a plurality of word lines WL and a plurality of bit lines BL intersect with each other and a memory cell MC is arranged on each intersection thereof (only one word line WL, one bit line BL, and one memory cell MC are illustrated in FIG. 5). The bit line BL is connected to a corresponding sense amplifier SA in a sense circuit 82.

The relief circuit 73 stores the row address corresponding to a defective word line WL and the row address corresponding to the word line WL with which the defective word line WL is replaced by associating them with each other for each bank address BANK. The storage is realized by an anti-fuse element or a fuse element.

An X-series control circuit 72 instructs the relief circuit 73 to output the row address when the read command READ or the write command WRITE is activated. The relief circuit 73, in response to the instruction, outputs the row address supplied from the latch circuit 66 to a row decoder (X decoder) 81 corresponding to the bank address BANK supplied from the latch circuit 66. However, when the row address supplied from the latch circuit 66 is the one stored as the row address corresponding to the defective word line WL, not the supplied row address but the row address corresponding to the word line WL with which the defective word line WL is replaced is output to the row decoder 81. The row decoder 81 selects any word line WL included in the memory cell array 11 based on the row address thus input. In the memory cell MC connected to the selected word line WL, a cell capacitor is connected to the bit line BL.

The relief circuit 71 stores the column address corresponding to a defective bit line BL and the column address corresponding to the bit line BL with which the defective bit line BL is replaced by associating them with each other for each bank address BANK. The storage also is realized by the anti-fuse element or the fuse element.

A Y-series control circuit 70 instructs the relief circuit 71 to output the column address when the read command READ or the write command WRITE is activated. The relief circuit 71, in response to the instruction, outputs the column address supplied from the latch circuit 66 to a column decoder (Y decoder) 83 corresponding to the bank address BANK supplied from the latch circuit 66. However, when the column address supplied from the latch circuit 66 is the one stored as the column address corresponding to the defective bit line BL, not the supplied column address but the column address corresponding to the bit line BL with which the defective bit line BL is replaced is output to the column decoder 83. The column decoder 83 generates a column selection signal (signal for selecting any bit line BL included in the memory cell array 11) based on the column address thus input and outputs the same to the column switch 12. The column switch 12 connects the bit line BL selected by the input column selection signal to a complementary main I/O line MIOT/B. The sense amplifier SA corresponding to the selected bit line BL is connected to the main amplifier 17 in the main amplifier circuit 84 through the complementary main I/O line MIOT/B.

The semiconductor device 1 is also provided with a refresh counter 74. The refresh counter 74 is a circuit which automatically generates the row address. At the time of refresh operation, the row address generated by the refresh counter 74 is supplied to the relief circuit 73 and refresh operation of the memory cell MC specified by the row address is performed. The present embodiment is not related to the refresh operation, so that the time of refresh operation is not described.

The data input/output terminal 15 is the terminal for outputting read data DQ and inputting write data DQ. The semiconductor device 1 is provided with eight data input/output terminals 15-0 to 15-7 as described later and is configured to be able to simultaneously input or output 8-bit data.

The input/output circuit 85 and the FIFO circuit 14 are provided between the data input/output terminal 15 and the main amplifier circuit 84 including the main amplifier 17. The FIFO circuit 14 and the main amplifier 17 are connected to each other by the read/write bus RWBS with the intermediate buffer 13 provided in the middle thereof. However, for two banks out of the eight banks, the intermediate buffer 13 is not provided between the FIFO circuit 14 and the main amplifier 17 related to each of the two banks. The FIFO circuit 14 is a first-in first-out circuit queuing the read data DQ or the write data DQ. The input/output circuit 85 and the intermediate buffer 13 are buffer circuits shaping a waveform of the read data DQ or the write data DQ.

At the time of reading, the read data DQ amplified by a sense amplifier SA is further amplified by the main amplifier 17 and passes through the FIFO circuit 14 and the input/output circuit 85 to be output to outside from the data input/output terminal 15. On the other hand, at the time of writing, the write data DQ input from outside through the data input/output terminal 15 is supplied to the main amplifier 17 through the input/output circuit 85 and the FIFO circuit 14 and is amplified to be supplied to the sense amplifier SA.

The main amplifier circuit 84 includes a Y0, Y1, Y2 switching circuit 19 and the Y11 multiplexer 16 in addition to the above-described main amplifier 17. The Y0, Y1, Y2 switching circuit 19 is the circuit outputting 8-bit parallel data by dividing the same into first 4 bits and latter 4 bits at the time of reading and outputting serially supplied 4-bit data as the 8-bit parallel data at the time of writing. The Y11 multiplexer 16 serves to switch a connection relationship of the main amplifier 17 and the read/write bus RWBS depending on whether the semiconductor device 1 operates in the ×8 operation (first operation mode) or the ×4 operation (second operation mode). This will be described in more detail later.

A timing at which the input/output circuit 85 takes the write data DQ from the data input/output terminal 15 is controlled by complementary data strobe signals DQS and /DQS supplied from the data strobe terminal 87 through the input/output circuit 86. At the time of reading, the input/output circuit 86 generates the complementary data strobe signals DQS and /DQS, which are criteria of data output operation, and outputs them from the data strobe terminal 87 to outside.

Operation timings of the column switch 12, the intermediate buffer 13, the FIFO circuit 14, the input/output circuits 85 and 86 are controlled by various control signals generated by the control circuit 20. The various control signals also are described in detail later.

The power supply terminal 90 is the terminal to which external power supply voltages VDD and VSS are supplied. An internal voltage generator circuit 91 generates various internal voltages based on the external power supply voltages VDD and VSS and supplies them to each circuit in the semiconductor device 1.

An entire configuration of the semiconductor device 1 according to this embodiment has been described above. Next, a configuration of each part of the semiconductor device 1 is described in more detail. In the following description, a basic configuration and operation of each part of the semiconductor device 1 are first described, and thereafter a configuration for realizing the high-speed operation by inhibiting the skew between banks even when the number of stages of the intermediate buffer is different based on the FIFO circuit 14 at the time of reading and based on the column decoder (Y decoder) 83 at the time of writing for each bank is described in detail.

Figure 3:
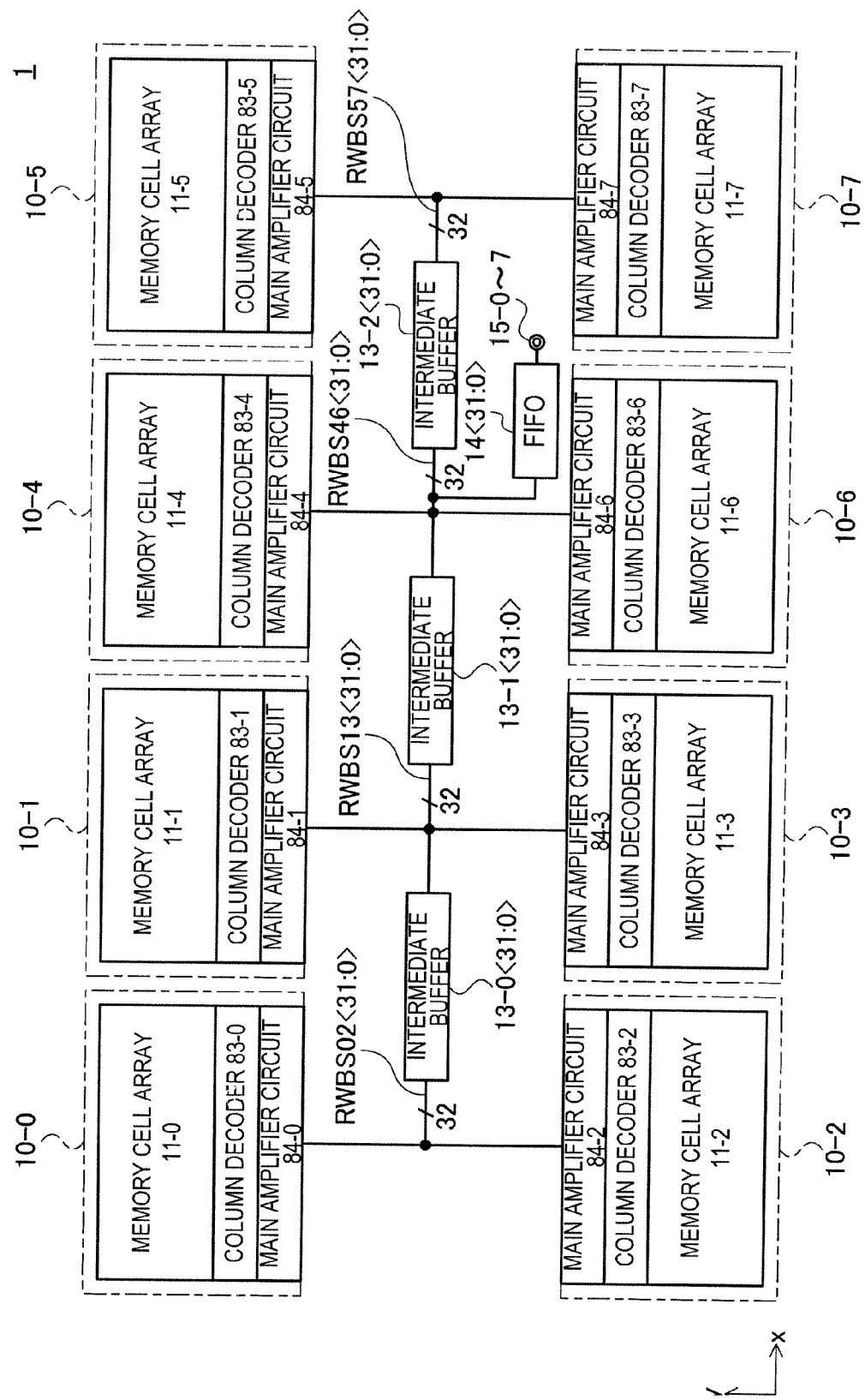
FIG. 3 is a planar view of the semiconductor device 1 shown in FIG. 2.

Turing to FIG. 3, the semiconductor device 1 according to this embodiment is provided with eight banks 10-0 to 10-7. The banks 10-0 and 10-2, the banks 10-1 and 10-3, the banks 10-4 and 10-6, and the banks 10-5 and 10-7 are arranged so as to be opposed to each other in the y-direction, respectively. Also, the banks 10-0, 10-1, 10-4, and 10-5 are arranged in the x-direction in this order. Similarly, the banks 10-2, 10-3, 10-6, and 10-7 are arranged in the x-direction in this order. Memory cell arrays 11-0 to 11-7 are arranged in the banks 10-0 to 10-7, respectively.

Read/write buses RWBS02<31:0>, read/write buses WBS13<31:0>, read/write buses RWBS46<31:0>, and read/write buses RWBS57<31:0> extending in the x-direction are provided in the wiring areas each of which is the area between a plurality of banks arranged so as to be opposed in the y-direction. Herein, an expression of "read/write bus RWBSxy" is intended to mean the read/write bus connected to both of memory cell arrays 11-$x$ and 11-$y$ and extending in the area between the banks 10-$x$ and 10-$y$ in the x-direction. Also, an expression of "z<n:0>" is intended to mean that there are n+1 (0-th to n-th) configurations z. An expression of "z<m>" is also used in this embodiment and this is intended to mean an m-th of the n+1 configurations z. To describe specifically, the expression of "read/write bus RWBS02<31:0>" is intended to mean 32 read/write buses connected to both of the memory cell arrays 11-0 and 11-2 and extending in the area between the banks 10-0 and 10-2 in the x-direction. Also, the expression of "read/write bus RWBS02<0>" is intended to mean a 0-th of the 32 read/write buses RWBS02<31:0>.

A column decoder 83-n and a main amplifier circuit 84-n are arranged on positions closer to the wiring area in a bank 10-n (n is an integer of 0 to 7). The column switch 12 (FIG. 2) included in the column decoder 83-n, though not illustrated in FIG. 3, supplies the above-described column selection signal to each of 64 column switches 12-n<63:0>. Each of the column switches 12-n<63:0> connects a predetermined bit line BL to predetermined complementary main IO lines MIOT and MIOB. The complementary main IO lines MIOT and MIOB indicate information of one data by two lines.

Figure 4:
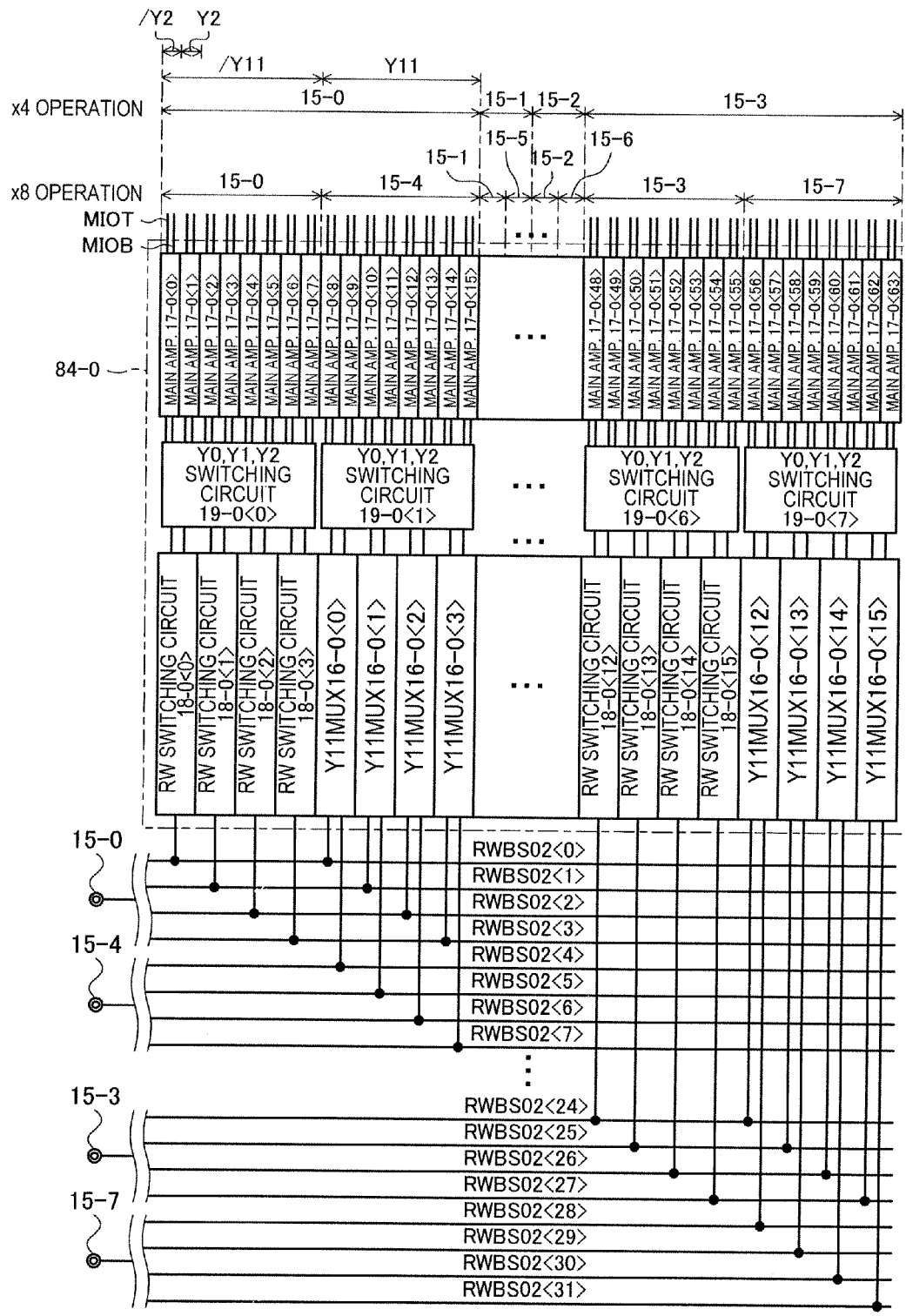
FIG. 4 is a view indicative of an embodiment of a configuration of the main amplifier circuit 84-0 shown in FIG. 3.

FIG. 4 is a view illustrating a configuration of the main amplifier circuit 84-0. Although not illustrated, the main amplifier circuits 84-1 to 84-7 also have the similar configuration. In the drawing, a correspondence relationship between the main amplifiers 17 and the data input/output terminals 15 is also illustrated for each of the ×8 operation and the ×4 operation. As illustrated in the drawing, the main amplifier circuit 84-0 includes main amplifiers 17-0<63:0>, Y0, Y1, Y2 switching circuits 19-0<7:0>, Y11 multiplexers (Y11MUX) 16-0<15:0>, and read/write (RW) switching circuits 18-0<15:0> (switching circuits). The main amplifiers 17-0<0> to 17-0<63> are arranged in line in the x-direction to be connected to the corresponding column switches 12-0<0> to 12-0<63> (not illustrated) through a plurality of corresponding complementary main IO lines MIOT and MIOB, respectively.

The 64 main amplifiers 17-0<63:0>, in which sequential eight main amplifiers from the main amplifier 17-0<0> are made one unit, are connected to the corresponding eight Y0, Y1, Y2 switching circuits 19-0<7:0> as illustrated in FIG. 4. For example, the Y0, Y1, Y2 switching circuit 19-0<0> is connected to the four RW switching circuits 18-0<0> to 18-0<3>. Similarly, the Y0, Y1, Y2 switching circuit 19-0<2> is connected to the RW switching circuits 18-0<4> to 18-0<7>, the Y0, Y1, Y2 switching circuit 19-0<4> is connected to the RW switching circuits 18-0<8> to 18-0<11>, and the Y0, Y1, Y2 switching circuit 19-0<6> is connected to the RW switching circuits 18-0<12> to 18-0<15>. The RW switching circuits 18-0<0> to 18-0<3>, 18-0<4> to 18-0<7>, 18-0<8> to 18-0<11>, and 18-0<12> to 18-0<15> are connected to the read/write buses RWBS02<0> to RWBS02<3>, RWBS02<8> to RWBS02<11>, RWBS02<16> to RWBS02<19>, and RWBS02<24> to RWBS02<27>, respectively. On the other hand, the Y0, Y1, Y2 switching circuit 19-0<1> is connected to the four Y11 multiplexers 16-0<0> to 16-0<3>, for example. Similarly, the Y0, Y1, Y2 switching circuit 19-0<3> is connected to the Y11 multiplexers 16-0<4> to 16-0<7>, the Y0, Y1, Y2 switching circuit 19-0<5> is connected to the Y11 multiplexers 16-0<8> to 16-0<11>, and the Y0, Y1, Y2 switching circuit 19-0<7> is connected to the Y11 multiplexers 16-0<12> to 16-0<15>. Each of the Y11 multiplexers 16-0<0> to 16-0<15> is connected to the corresponding two read/write buses RWBS. Specifically, the Y11 multiplexer 16-0<0> is connected to the read/write buses RWBS02<0> and RWBS02<4>, the Y11 multiplexer 16-0<1> is connected to the read/write buses RWBS02<1> and RWBS02<5>, and the Y11 multiplexer 16-0<2> is connected to the read/write buses RWBS02<2> and RWBS02<6>, respectively. This applies to the following description.

As described in detail later, the Y11 multiplexer 16-0 connects the read/write bus RWBS02, to which the RW switching circuit 18-0 is not connected, out of the two connected read/write buses RWBS02 to the corresponding Y0, Y1, Y2 switching circuit 19-0 at the time of ×8 operation according to the above-described operation mode signal PBX8B. On the other hand, at the time of ×4 operation, the Y11 multiplexer 16-0 connects the read/write bus RWBS02, to which the RW switching circuit 18-0 is connected, out of the two connected read/write buses RWBS02 to the corresponding Y0, Y1, Y2 switching circuit 19-0. As an example, the Y11 multiplexer 16-0<0> connects the read/write bus RWBS02<4> to the Y0, Y1, Y2 switching circuit 19-0<1> at the time of ×8 operation. On the other hand, the Y11 multiplexer 16-0<0> connects the read/write bus RWBS02<0> to the Y0, Y1, Y2 switching circuit 19-0<1> at the time of ×4 operation.

The read/write buses RWBS02<0> to RWBS02<3> are associated with the data input/output terminal 15-0. Also, the read/write buses RWBS02<4> to RWBS02<7> are associated with the data input/output terminal 15-4. Hereinafter, similarly, the read/write buses RWBS02<8> to RWBS02<11> are associated with the data input/output terminal 15-1, the read/write buses RWBS02<12> to RWBS02<15> are associated with the data input/output terminal 15-5, the read/write buses RWBS02<16> to RWBS02<19> are associated with the data input/output terminal 15-2, the read/write buses RWBS02<20> to RWBS02<23> are associated with the data input/output terminal 15-6, the read/write buses RWBS02<24> to RWBS02<27> are associated with the data input/output terminal 15-3, and the read/write buses RWBS02<28> to RWBS02<31> are associated with the data input/output terminal 15-7, respectively.

Therefore, for example, the main amplifiers 17-0<0> to 17-0<7> connected to the read/write buses RWBS02<0> to RWBS02<3> through the RW switching circuits 18-0<0> to 18-0<3>, respectively, are associated with the data input/output terminal 15-0 irrespective of the operation mode of the semiconductor device 1 (in both of the ×8 operation and the ×4 operation) as illustrated. On the other hand, the main amplifiers 17-0<8> to 17-0<15> connected to the read/write buses through the Y11 multiplexers 16-0<0> to 16-<3> are associated with the data input/output terminal 15-4 through the read/write buses RWBS02<4> to RWBS02<7> at the time of ×8 operation and associated with the data input/output terminal 15-0 through the read/write buses RWBS02<0> to RWBS02<3> at the time of ×4 operation. The same applies also to other main amplifiers 17-0.

Next, FIG. 5 is a view illustrating a configuration of the control circuit 20. Although only a part related to the column switches 12-4<0> and 12-4<4> of the bank 10-4 and the column switches 12-5<0> and 12-5<4> of the bank 10-5 is illustrated in the drawing, the same applies also to a part related to another bank and column switch.

As illustrated in FIG. 5, the control circuit 20 includes a main amplifier (MA)/column switch (YS) control circuit 21-n controlling the column decoder 83-n and the main amplifier circuit 84-n in the bank 10-n (n is an integer of 0 to 7), an intermediate buffer control circuit 22-m controlling an intermediate buffer 13-m (m is an integer of 0 to 2), and a FIFO control circuit 23 controlling the FIFO circuit 14.

Each MA/YS control circuit 21-n receives the above-described control command CYCLKT (Read), control command CYCLKT (Write), control command DRCLKT, control command DWCLKT, Y11 selection signal Y11T, and operation mode signal PBX8B and generates control signals CYSET-n (first control signal or second control signal), DRCLKT1-n, and DWCLKT1-n based on them. Among them, the control signal CYSET-n is input to the corresponding column decoder 83-n and the control signals DRCLKT1-n and DWCLKT1-n are input to the corresponding main amplifier circuit 84-n. Meanwhile, in the following description, in case that it is not especially required to clarify correspondence relationship with the bank, the control signal DRCLKT1-n, for example, may be simply written as the control signal DRCLKT1 by omitting "-n". The same applies also to other control signals.

Figure 6A:
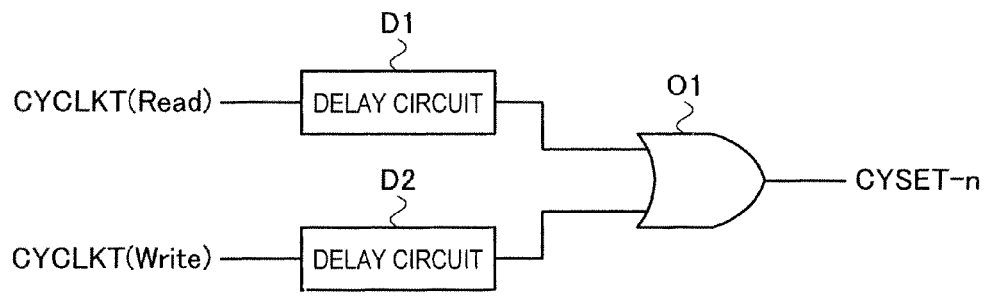
FIGS. 6A and 6B are circuit diagrams indicative of an embodiment of an internal configuration of the MA/YS control circuit 21-n partly shown in FIG. 2.
Figure 6B:
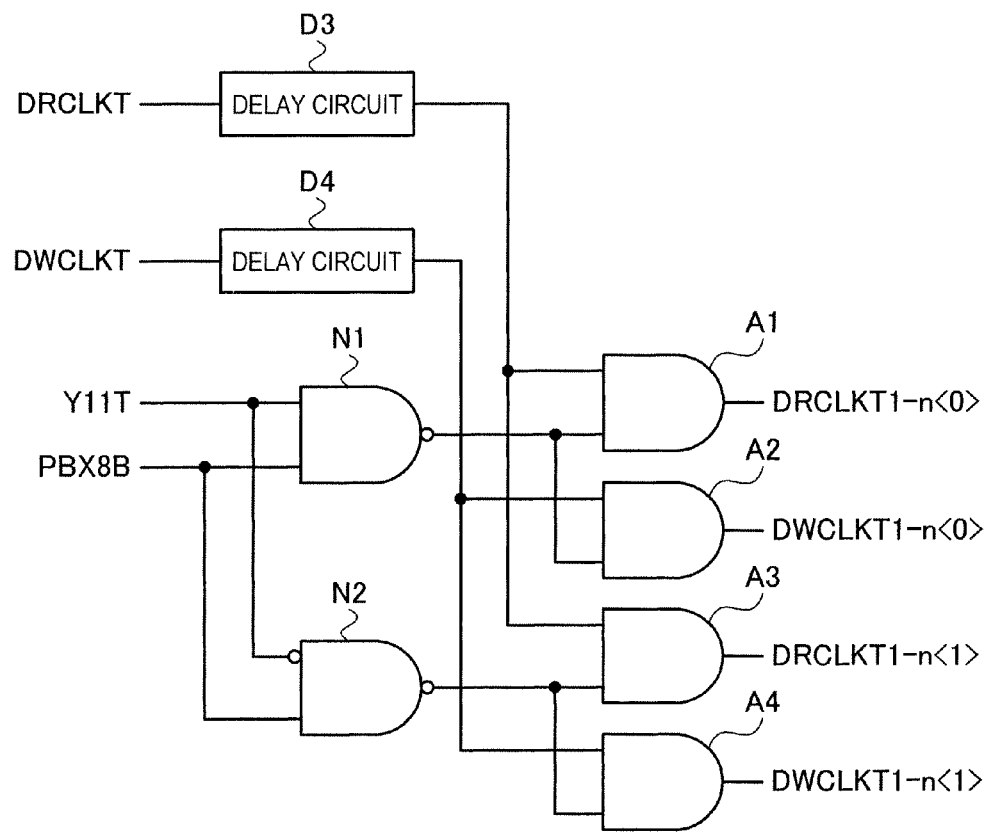

FIG. 6A is the circuit diagram of a part generating the control signal CYSET-n and FIG. 6B is the circuit diagram of a part generating the control signals DRCLKT1-n and DWCLKT1-n. As is clear from the drawings, the part generating the control signal CYSET-n and the part generating the control signals DRCLKT1-n and DWCLKT1-n are independent from each other. Also, the control signal DRCLKT1-n includes a control signal DRCLKT1-n<0> (third control signal) and a control signal DRCLKT1-n<1> (fifth control signal), and the control signal DWCLKT1-n includes a control signal DWCLKT1-n<0> (fourth control signal) and a control signal DWCLKT1-n<1> (sixth control signal).

As illustrated in FIG. 6A, the MA/YS control circuit 21-n includes a delay circuit D1 (first delay circuit), a delay circuit D2 (second delay circuit), and an OR circuit O1. The control command CYCLKT (Read) is input to the delay circuit D1 and the control command CYCLKT (Write) is input to the delay circuit D2. An output signal (first control signal) of the delay circuit D1 and an output signal (second control signal) of the delay circuit D2 are input to the OR circuit O1 and an output of the OR circuit O1 becomes the control signal CYSET-n. The column switches 12-n<31:0> of the bank 10-n electrically conduct when the control signal CYSET generated by the corresponding MA/YS control circuit 21-n is activated (when at least one of the first and second control signals is activated), and do not conduct in other cases.

The delay amount at the time of reading for the corresponding bank 10-n is set in advance in the delay circuit D1. A specific value of the delay amount is determined such that the time from supply of the read command READ to the command terminal 52 to the timing at which the read data DQ read from each of the memory cell arrays 11 arrives at the FIFO circuit 14 is the same in each of the banks. Also, the delay amount at the time of writing for the corresponding bank 10-n is set in advance in the delay circuit D2. A specific value of the delay amount is determined such that the corresponding column switch 12 electrically conducts so as to match the timing at which the write data DQ supplied from outside to the data input/output terminal 15 arrives at the column switch 12. The delay amounts are described later in more detail. That is, the delay amounts included in the delay circuits D1 and D2 are different for each of a plurality of banks. In other words, as illustrated in FIG. 5, the delay amounts of a plurality of delay circuits D1 and a plurality of delay circuits D2 included in a plurality of control circuits 21 corresponding to each of a plurality of banks are different from one another.

As illustrated in FIG. 6B, the MA/YS control circuit 21-n further includes delay circuits D3 and D4, NAND circuits N1 and N2, and AND circuits A1 to A4. The control command DRCLKT is input to the delay circuit D3 and the control command DWCLKT is input to the delay circuit D4. Also, the Y11 selection signal Y11T and the operation mode signal PBX8B are input to the NAND circuit N1 and an inversion signal of the Y11 selection signal Y11T and the operation mode signal PBX8B are input to the NAND circuit N2. An output of the delay circuit D3 is input to the AND circuits A1 and A3. An output of the delay circuit D4 is input to the AND circuits A2 and A4. An output of the NAND circuit Ni is input to the AND circuits A1 and A2. An output of the NAND circuit N2 is input to the AND circuits A3 and A4. Output signals of the AND circuits A1 to A4 become the control signal DRCLKT1-n<0> (third control signal), the control signal DWCLKT1-n<0> (fourth control signal), the control signal DRCLKT1-n<1> (fifth control signal), and the control signal DRCLKT1-n<2> (sixth control signal), respectively.

The delay amount at the time of reading for the corresponding bank 10-n is set in advance also in the delay circuit D3. The delay amount at the time of writing for the corresponding bank 10-n is set in advance also in the delay circuit D4. Specific values of the delay amounts are determined such that the corresponding RW switching circuit 18 and Y11 multiplexer 16 operate at the timing at which the read data DQ (at the time of reading) or the write data DQ (at the time of writing) arrives at the corresponding circuit. That is, the delay amounts included in the delay circuit D3 and the delay circuit D4 are different for each of a plurality of banks. In other words, as illustrated in FIG. 5, the delay amounts of a plurality of delay circuits D3 and a plurality of delay circuits D4 included in a plurality of control circuits 21 corresponding to each of a plurality of banks are different from one another. The delay amounts also are described later in more detail.

Figures 7A, 7B:
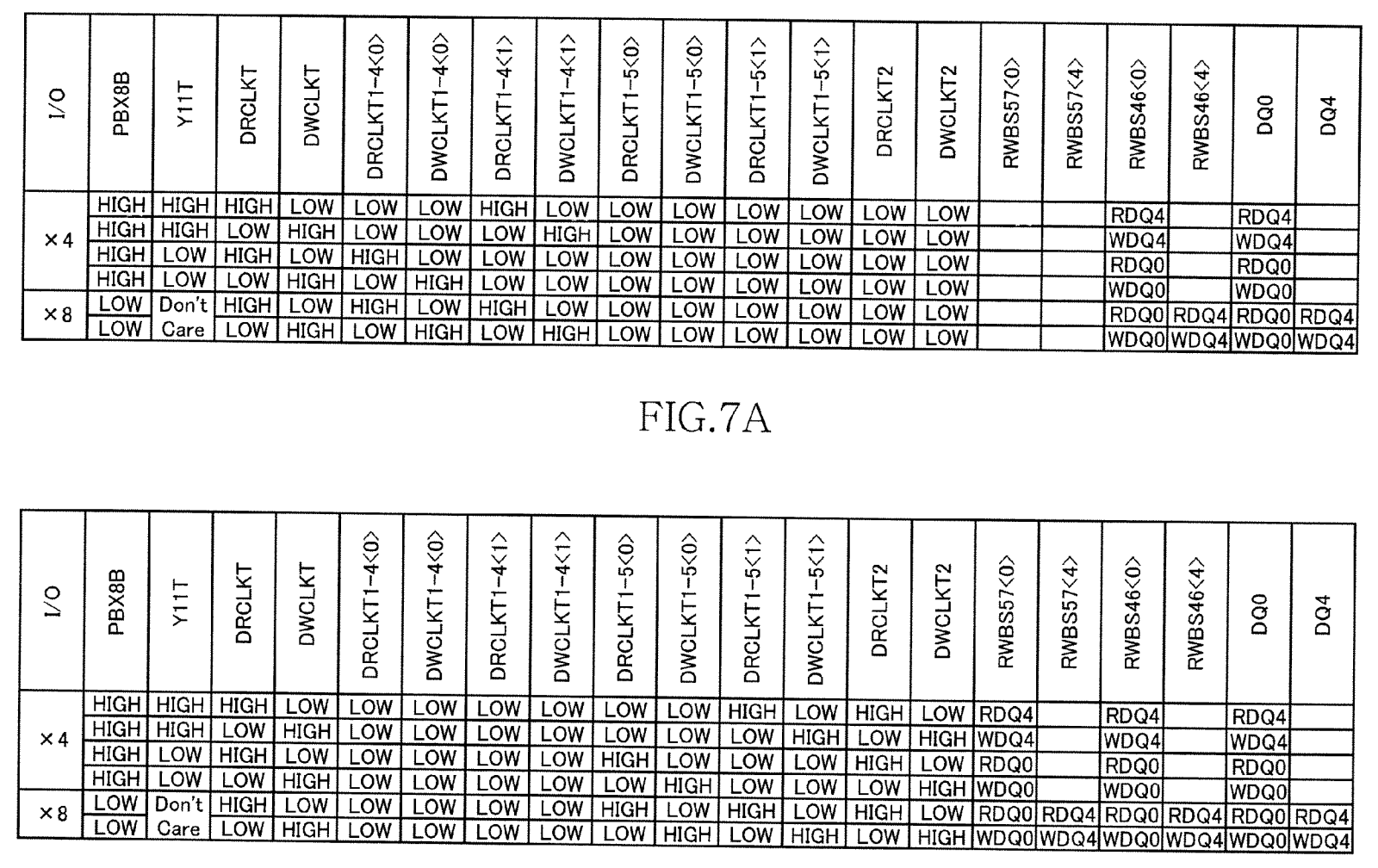

FIG. 7A illustrates the table of truth value when the access target is the bank 10-4 and FIG. 7B illustrates the table of truth value when the access target is the bank 10-5. As a result of a process of the MA/YS control circuit 21-n, the value of each control signal is as indicated in FIGS. 7A and 7B.

Meanwhile, as is understood from FIGS. 7A and 7B, the MA/YS control circuit 21-n generates each control signal only when the corresponding bank 10-n is the access target and otherwise this does not generate the same. That is, in FIG. 7A illustrating a case in which the access target is the bank 10-4, for example, although the control signals DRCLKT1-4 and DWCLKT1-4 change according to the operation mode signal PBX8B and the like, the control signals DRCLKT1-5 and DWCLKT1-5 are fixed to be low. Although not illustrated in FIG. 5, such operation is realized by that each MA/YS control circuit 21-n refers to the bank address BANK input from the latch circuit 66 to the control circuit 20. Also, as is understood from FIG. 7A, when the access target is the bank 10-4, the RWBS57 related to the banks 10-5 and 10-7 are not allocated. When the access target is the bank 10-4 and the I/O is in the ×4 mode, the RWBS46<4> is not allocated. This is as illustrated in FIG. 4 above. Further, as is understood from FIG. 7B, when the access target is the bank 10-5 and the I/O is in the ×4 mode, the RWBS57<4> is not allocated.

Figure 8:
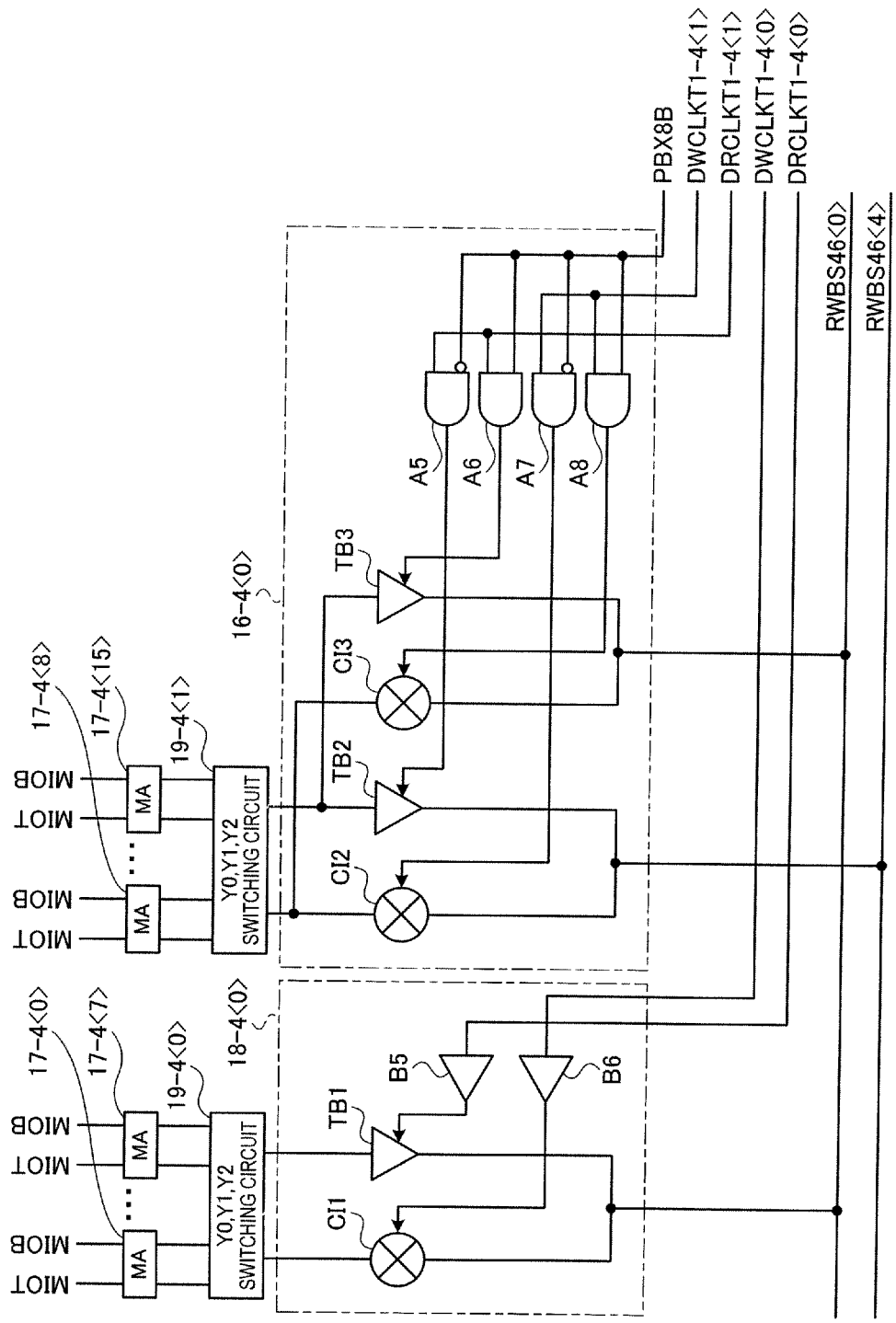
FIG. 8 is a circuit diagram indicative of an embodiment of internal configurations of a RW switching circuit 18-4<0> and a Y11 multiplexer 16-4<4> shown in FIG. 5.

FIG. 8 is a circuit diagram illustrating internal configurations of a RW switching circuit 18-4<0> and a Y11 multiplexer 16-4<4>. Although not illustrated, another RW switching circuit 18 and Y11 multiplexer 16 have the similar configurations.

As illustrated in FIG. 8, first, the RW switching circuit 18-4<0> includes a clocked inverter CI1, a three-state buffer TB1, and buffers B5 and B6. Each of the clocked inverter CI1 and the three-state buffer TB1 is connected between a corresponding main amplifier 17-4<0> and the read/write bus RWBS46<0>. The clocked inverter CI1 is an element corresponding to the write operation. An input node of the clocked inverter CI1 is connected to the read/write bus RWBS46<0>. An output node of the clocked inverter CI1 is connected to the main amplifier 17-4<0>. On the other hand, the three-state buffer TB1 is an element corresponding to the read operation. An input node of the three-state buffer TB1 is connected to the main amplifier 17-4<0>. An output node of the three-state buffer TB1 is connected to the read/write bus RWBS46<0>.

The control signal DWCLKT1-4<0> is input to a control input of the clocked inverter CI1 through the buffer B6. The control signal DRCLKT1-4<0> is input to the control input of the three-state buffer TB1 through the buffer B5.

By the above-described configuration, at the time of reading (when the control signal DRCLKT1-4<0> is high), the main amplifier 17-4<0> and the read/write bus RWBS46<0> are connected to each other through the three-state buffer TB1 and the data flows from the former to the latter. On the other hand, at the time of writing (when the control signal DWCLKT1-4<0> is high), the main amplifier 17-4<0> and the read/write bus RWBS46<0> are connected to each other through the clocked inverter CI1 and the data flows from the latter to the former. Also, when both of the control signals DRCLKT1-4 and DWCLKT1-4 are low, all of the clocked inverters CI1 to CI3 and the three-state buffers TB1 to TB3 are put into a high-impedance state, and the data does not flow in either direction.

Next, the Y11 multiplexer 16-4<0> includes clocked inverters CI2 and CI3, three-state buffers TB2 and TB3, and AND circuits A5 to A8. Each of the clocked inverter CI2 and the three-state buffer TB2 is connected between the corresponding main amplifier 17-4<0> and the read/write bus RWBS46<4>. On the other hand, each of the clocked inverter CI3 and the three-state buffer TB3 is connected between the corresponding main amplifier 17-4<0> and the read/write bus RWBS46<0>. An input of each of the clocked inverters CI2 and CI3 is connected to the corresponding read/writes bus and an output of each of them is connected to the main amplifier 17-4<0>, respectively. On the other hand, an input of each of the three-state buffers TB2 and TB3 is connected to the main amplifier 17-4<0> and an output of each of them is connected to the corresponding read/write bus, respectively.

An inversion signal of the operation mode signal PBX8B and the control signal DRCLKT1-4<1> are input to the AND circuit A5. The operation mode signal PBX8B and the control signal DRCLKT1-4<1> are input to the AND circuit A6. The inversion signal of the operation mode signal PBX8B and the control signal DWCLKT1-4<1> are input to the AND circuit A7. The operation mode signal PBX8B and the control signal DWCLKT1-4<1> are input to the AND circuit A8.

Outputs of the AND circuits A5 to A8 are input to control inputs of the three-state buffer TB2, the three-state buffer TB3, the clocked inverter CI2, and the clocked inverter CI3, respectively.

By the above-described configuration, at the time of reading in the ×8 operation (when the operation mode signal PBX8B is low and the control signal DRCLKT1-4<1> is high), the main amplifier 17-4<4> and the read/write bus RWBS46<4> are connected to each other through the three-state buffer TB2 and the data flows from the former to the latter. At the time of writing in the ×8 operation (when the operation mode signal PBX8B is low and the control signal DWCLKT1-4<1> is high), the main amplifier 17-4<4> and the read/write bus RWBS46<4> are connected to each other through the clocked inverter CI2 and the data flows from the latter to the former. At the time of reading in the ×4 operation (when the operation mode signal PBX8B is high and the control signal DRCLKT1-4<1> is high), the main amplifier 17-4<4> and the read/write bus RWBS46<0> are connected to each other through the three-state buffer TB3 and the data flows from the former to the latter. At the time of writing in the ×4 operation (when the operation mode signal PBX8B is high and the control signal DWCLKT1-4<1> is high), the main amplifier 17-4<4> and the read/write bus RWBS46<0> are connected to each other through the clocked inverter CI3 and the data flows from the latter to the former.

FIG. 5 is referred to again. Each intermediate buffer control circuit 22-m receives the above-described control command DRCLKT and control command DWCLKT and generates a control signal DRCLKT2 (seventh control signal) and a control signal DWCLKT2 (eighth control signal) based on them. Each of the generated control signals DRCLKT2 and DWCLKT2 is input to each corresponding intermediate buffer 13-m<31:0>.

Figure 9A:
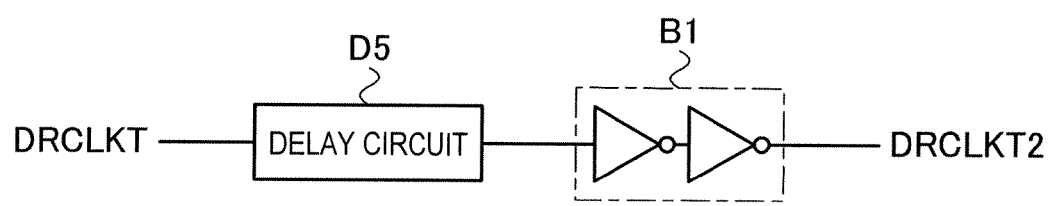
FIGS. 9A and 9B are circuit diagrams indicative of an embodiment of an internal configuration of the intermediate buffer control circuit 22-m partly shown in FIG. 5.
Figure 9B:
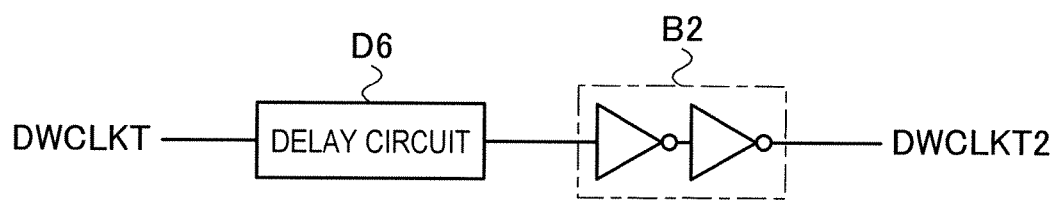

FIG. 9A is the circuit diagram of a part generating the control signal DRCLKT2 and FIG. 9B is the circuit diagram of a part generating the control signal DWCLKT2.

As illustrated in FIGS. 9A and 9B, the intermediate buffer control circuit 22-m includes delay circuits D5 and D6 and buffers B1 and B2. The control command DRCLKT is input to the delay circuit D5 and the control command DWCLKT is input to the delay circuit D6. Outputs of the delay circuits D5 and D6 are input to the buffers B1 and B2, respectively, and output signals of the buffers B1 and B2 become the control signal DRCLKT2 (seventh control signal) and the control signal DWCLKT2 (eighth control signal), respectively.

The delay amounts set in the delay circuits D5 and D6 also are set such that the corresponding intermediate buffer 13 matches a timing at which the read data DQ (at the time of reading) or the write data DQ (at the time of writing) arrives at the intermediate buffer 13 as the delay amount set in the delay circuits D3 and D4. The delay amounts also are described later in more detail.

FIGS. 7A and 7B above also illustrate the tables of truth value of the control signals DRCLKT2 and DWCLKT2. As a result of a process of the intermediate buffer control circuit 22-m, values of the control signals DRCLKT2 and DWCLKT2 are as indicated in FIGS. 7A and 7B.

Herein, FIG. 7A also illustrates a relationship between a state of each signal and the data appearing in the read/write buses RWBS46<0> and RWBS46<4> related to the banks 10-4 and 10-6, the read/write buses RWBS57<0> and RWBS57<4> related to the banks 10-5 and 10-7, and the data input/output terminals 15-0(DQ0) and 15-4(DQ4) when the reading and writing of data are performed with the bank 10-4 as the access target. FIG. 7B also illustrates the relationship between the state of each signal and the data appearing in the read/write buses RWBS46<0> and RWBS46<4> related to the banks 10-4 and 10-6, the read/write buses RWBS57<0> and RWBS57<4> related to the banks 10-5 and 10-7, and the data input/output terminals 15-0(DQ0) and 15-4(DQ4) when the reading and writing of the data are performed with the bank 10-5 as the access target. Meanwhile, in FIGS. 7A and 7B, "RDQ0" represents the data read from the corresponding memory cell array through the column switch 12-4<0> or the column switch 12-5<0>, "WDQ0" represents the data written to the corresponding memory cell array through the column switch 12-4<0> or the column switch 12-5<0>, "RDQ4" represents the data read from the corresponding memory cell array through the column switch 12-4<4> or the column switch 12-5<4>, and "WDQ4" represents the data written to the corresponding memory cell array through the column switch 12-4<4> or the column switch 12-5<4>.

As is understood from FIG. 7A, when the access target is the bank 10-4, the signal does not flow to the read/write bus RWBS57 related to the banks 10-5 and 10-7. This is for preventing conflict of the data (bus fight) by not allowing the data to flow to the read/write bus which is not necessary for data transfer and for reducing power consumption. Specifically, this is realized by that each intermediate buffer control circuit 22-m refers to the bank address BANK input from the latch circuit 66 to the control circuit 20.

To give an example with reference to FIG. 3, when the access target is the bank 10-4 or 10-6 (FIG. 7A), it is not necessary to pass the data to the read/write buses RWBS57, RWBS13, and RWBS02 (FIG. 3). Therefore, in this case, a plurality of intermediate buffer control circuits 22-0 to 22-3 related to them deactivate the control signals DRCLKT2 and DWCLKT2 and put a plurality of corresponding intermediate buffers 13-0 to 13-2 into the high-impedance state. According to this, the read data DQ or the write data DQ corresponding to the bank 10-4 or 10-5 is prevented from flowing to the read/write buses RWBS57, RWBS13, and RWBS02, and also, the power consumption is reduced.

Figure 10:
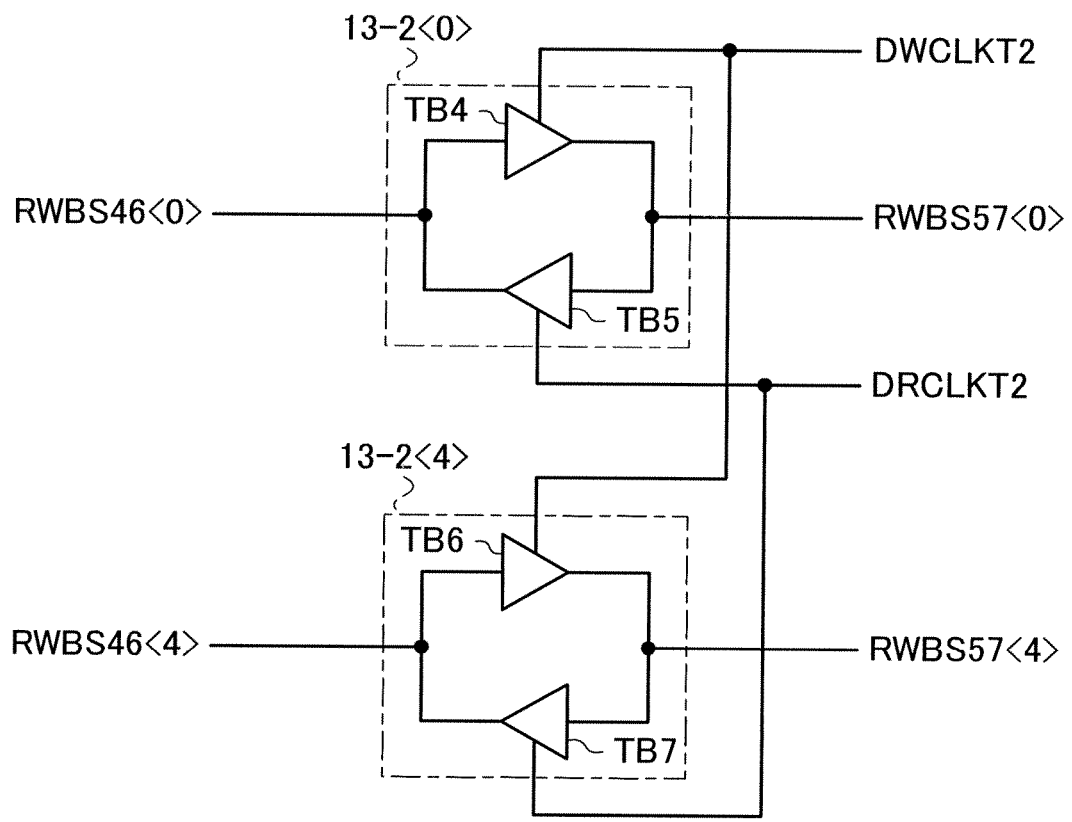
FIG. 10 is a circuit diagram indicative of an embodiment of internal configurations of the intermediate buffers 13-2<0> and 13-2<4> shown in FIG. 5.

Turning to FIG. 10, although not illustrated, another intermediate buffer 13 has the similar configuration.

As illustrated in FIG. 10, the intermediate buffer 13-2<0> includes three-state buffers TB4 and TB5 and the intermediate buffer 13-2<4> includes three-state buffers TB6 and TB7. An input node and an output node of the three-state buffer TB4 are connected to the read/write bus RWBS46<0> and the read/write bus RWBS57<0>, respectively. An input node and an output node of the three-state buffer TB5 are connected to the read/write bus RWBS57<0> and the read/write bus RWBS46<0>, respectively. An input node and an output node of the three-state buffer TB6 are connected to the read/write bus RWBS46<4> and the read/write bus RWBS57<4>, respectively. An input node and an output node of the three-state buffer TB7 are connected to the read/write bus RWBS57<4> and the read/write bus RWBS46<4>, respectively.

The control signal DWCLKT2 is input to control nodes of the three-state buffers TB4 and TB6. The control signal DRCLKT2 is input to control nodes of the three-state buffers TB5 and TB7.

With the above-described configuration, at the time of reading (when the control signal DRCLKT2 is high), the data flows from the read/write bus RWBS57<0> to the read/write bus RWBS46<0> and the data flows from the read/write bus RWBS57<4> to the read/write bus RWBS46<4>. On the other hand, at the time of writing (when the control signal DWCLKT2 is high), the data flows from the read/write bus RWBS46<0> to the read/write bus RWBS57<0> and the data flows from the read/write bus RWBS46<4> to the read/write bus RWBS57<4>. Also, when both of the control signals DRCLKT2 and DWCLKT2 are low, all of the three-state buffers TB4 to TB7 are put into the high-impedance state and the data does not flow in either direction.

FIG. 5 is referred to again. The FIFO control circuit 23 receives the above-described control commands DRCLKT and DWCLKT and generates control signals DRCLKT3 and DWCLKT3 based on them. The generated control signals DRCLKT3 and DWCLKT3 are input to each FIFO circuit 14<31:0>.

Figure 11A:
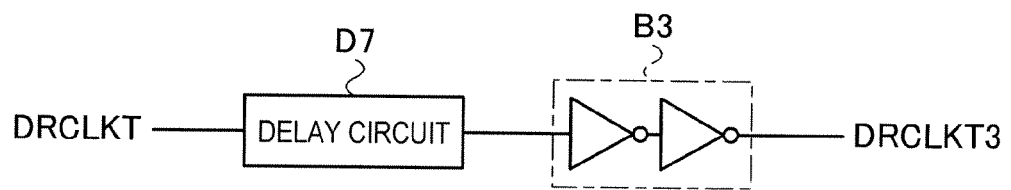
FIGS. 11A and 11B are circuit diagrams indicative of an embodiment of an internal configuration of the FIFO control circuit 23 shown in FIG. 5.
Figure 11B:
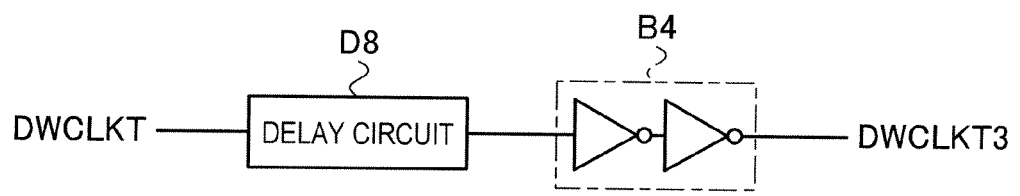

FIG. 11A is the circuit diagram of a part generating the control signal DRCLKT3 and FIG. 11B is the circuit diagram of a part generating the control signal DWCLKT3.

As illustrated in FIGS. 11A and 11B, the FIFO control circuit 23 includes delay circuits D7 and D8 and buffer B3 and B4. The control command DRCLKT is input to the delay circuit D7 and the control command DWCLKT is input to the delay circuit D8. Outputs of the delay circuits D7 and D8 are input to the buffers B3 and B4, respectively, and outputs of the buffers B3 and B4 become the control signals DRCLKT3 and DWCLKT3, respectively.

Predetermined delay amounts are set in advance in the delay circuits D7 and D8 irrespective of the access target out of a plurality of banks. Meanwhile, the reason why the delay amount of the delay circuit D7 is fixed irrespective of the selected bank is that the timing at which the read data DQ arrives at the FIFO circuit 14 is constant irrespective of the selected bank in the semiconductor device 1 due to the different delay amounts of the control signals CYSET, DRCLKT1, and DWCLKT1 for each bank.

FIGS. 7A and 7B are referred to again. As illustrated in the drawings, at the time of reading in the ×8 operation (when PBX8B is low), the data "RDQ0" is output to the data input/output terminal 15-0 through the read/write bus RWBS46<0>. On the other hand, the data "RDQ4" is output to the data input/output terminal 15-4 through the read/write bus RWBS46<4>. That is, there is one-to-one correspondence between the read/write bus RWBS46 and the data input/output terminal 15. The same applies also at the time of writing.

On the other hand, at the time of reading in the ×4 operation (when PBX8B is high), although the data "RDQ0" is output to the data input/output terminal 15-0 through the read/write bus RWBS46<0> as in the ×8 operation, the data "RDQ4" also is output to the data input/output terminal 15-0 through the read/write bus RWBS46<0>. That is, the data input/output terminal 15-4 is not used and both of the "RDQ0" and "RDQ4" are output from the data input/output terminal 15-0. The Y11 selection signal Y11T specifies the data to be output from the data input/output terminal 15-0. That is, when the Y11 selection signal Y11T is high, the "RDQ4" is output and when the Y11 selection signal Y11T is low, the "RDQ0" is output. The same applies also at the time of writing.

The basic configuration and the operation of each part of the semiconductor device 1 according to this embodiment are described above. Hereinafter, a configuration for inhibiting the skew between the banks so as to realize the high-speed operation even when the number of stages of the intermediate buffer is different for each bank is described in detail.

The semiconductor device 1 includes the intermediate buffers 13-0 to 13-2 as illustrated in FIG. 3. According to this, the number of stages of the intermediate buffer is different for each bank in the semiconductor device 1. Specifically, the number of stages of the intermediate buffer is 2 for the banks 10-0 and 10-2. On the other hand, the number of stages of the intermediate buffer is 1 for the banks 10-1, 10-3, 10-5, and 10-7. Also, the number of stages of the intermediate buffer is 0 for the banks 10-4 and 10-6. Although the number of stages of the intermediate buffer is different for each bank, in the semiconductor device 1, the skew between the banks is inhibited by appropriately selecting the delay amount set in each of the delay circuits D1 to D8 in the control circuit 20 and it is possible to realize the high-speed operation.

Figure 12:
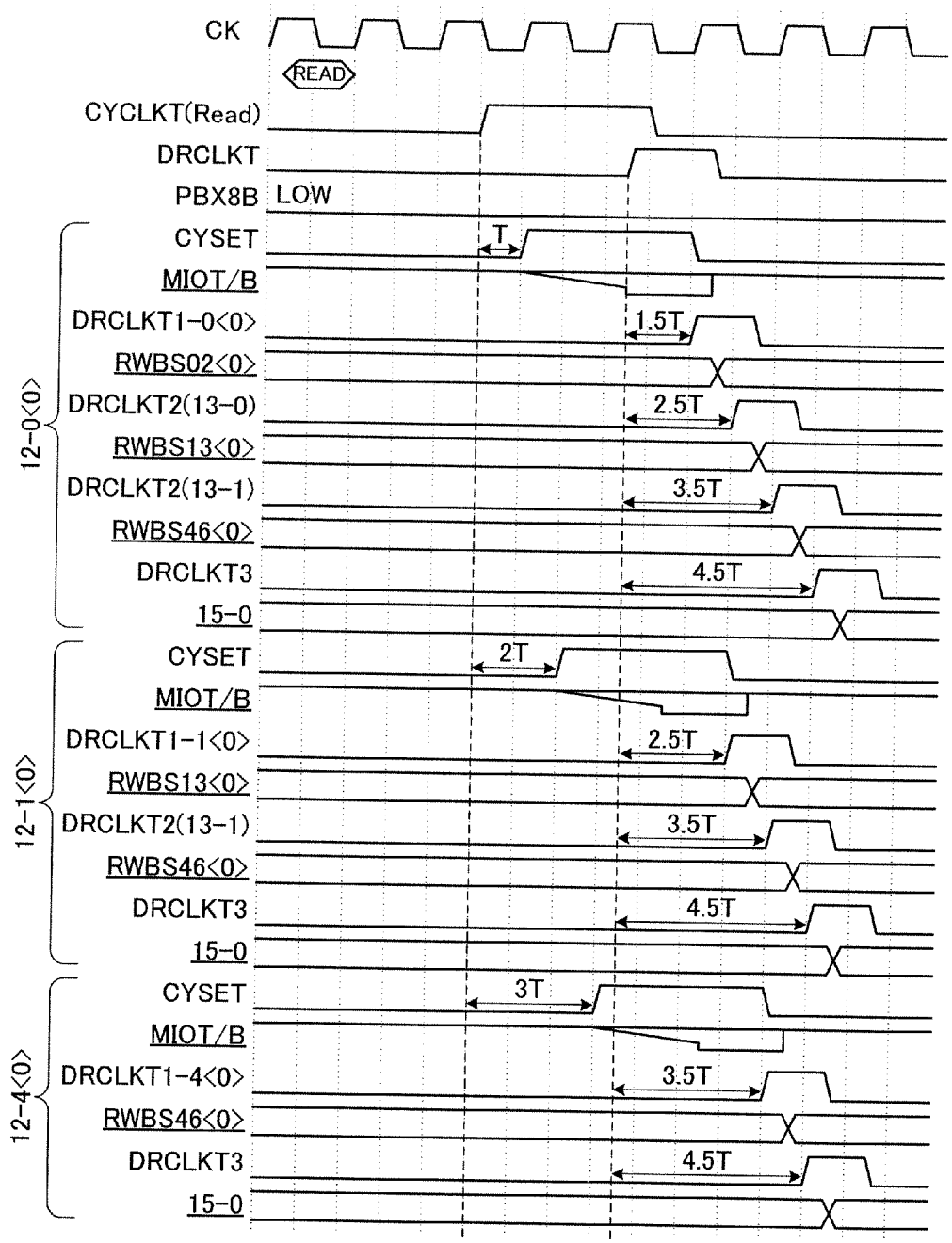
FIG. 12 is a view indicative of an embodiment of a time chart of each signal when the reading in the ×8 operation (operation mode signal PBX8B=low) is performed with the banks 10-0, 10-1, and 10-4 shown in FIG. 3 as the access target.

Turning to FIG. 12, three examples, which are a case of reading the data through the column switch 12-0<0>, a case of reading the data through the column switch 12-1<0>, and a case of reading the data through the column switch 12-4<0>, are illustrated.

As illustrated in FIG. 12, first, the read command READ is supplied from outside and this becomes a signal to start the reading. The command decoder 64 waits for a predetermined clock period after the read command READ is supplied and thereafter activates the control command CYCLKT (Read). Then, the command decoder 64 further waits for a predetermined clock period and thereafter activates the control command DRCLKT. The waiting periods are set as latency in the command decoder 64 in advance.

When the control command CYCLKT (Read) is activated, the control circuit 20 sequentially activates various control signals related to the reading at timings in accordance with the delay amounts set in the delay circuits D1, D3, D5, and D7 illustrated in FIGS. 6, 7, and 9. Although the control signals related to the column switches 12-0<0>, 12-1<0>, and 12-4<0> are illustrated in FIG. 12, the control signal is actually similarly activated in other parts.

Table 1 illustrates the delay amounts set in the delay circuits D1, D3, D5, and D7 in an example in FIG. 12. In the table, the delay amount is indicated by magnitude of delay of the control signal CYSET with respect to the control command CYCLKT (Read) for the delay circuit D1, and the delay amount is indicated by the magnitude of the delay of the corresponding control signal with respect to the control command DRCLKT for the delay circuits D3, D5, and D7. Also, T represents a half clock period and it is set that a delay time of one stage of the intermediate buffer equals to T.

TABLE 1

| TARGET CIRCUITS OF SETTING | | DELAY AMOUNTS |
|---|---|---|
| MA/YS CONTROL CIRCUITS 21-4, 21-6 | D1 | 3T |
| | D3 | 3.5T |
| MA/YS CONTROL CIRCUITS 21-1, 21-3, 21-5, 21-7 | D1 | 2T |
| | D3 | 2.5T |
| MA/YS CONTROL CIRCUITS 21-0, 21-2 | D1 | T |
| | D3 | 1.5T |
| INTERMEDIATE BUFFER CONTROL CIRCUIT 22-0 | D5 | 2.5T |
| INTERMEDIATE BUFFER CONTROL CIRCUITS 22-1, 22-2 | D5 | 3.5T |
| FIFO CONTROL CIRCUIT 23 | D7 | 4.5T |

Each delay amount indicated in Table 1 is determined according to the delay time T of one stage of the intermediate buffer. Specifically, as the delay amount when the number of stages of the intermediate buffer is k, the delay amount obtained by subtracting k×T from that when the number of stages is 0 is set.

For example, two delay amounts related to the banks 10-0 and 10-2 in which k=2 (delay amounts T and 1.5T set in the delay circuits D1 and D3 of the MA/YS control circuits 21-0 and 21-2) are obtained by subtracting 2T from delay amounts related to the banks 10-4 and 10-6 in which k=0 (delay amounts 3T and 3.5T set in the delay circuits D1 and D3 of the MA/YS control circuits 21-4 and 21-6). Also, the delay amount related to the intermediate buffer 13-0 in which k=1 (delay amount 2.5T set in the delay circuit D5 of the intermediate buffer control circuit 22-0) is obtained by subtracting T from the delay amount related to the intermediate buffers 13-1 and 13-2 in which k=0 (delay amount 3.5T set in the delay circuit D5 of the intermediate buffer control circuits 22-1 and 22-2).

By setting the above-described delay amount in each of the delay circuits, a timing at which the read data DQ arrives at the data input/output terminal 15-0 is the same irrespective of the bank, which is the access target, as illustrated in FIG. 12. In this manner, according to the semiconductor device 1 of this embodiment, it becomes possible to make the timing at which the read data DQ arrives at the data input/output terminal 15-0 constant irrespective of the bank at the time of reading in the x8 operation.

Figure 13:
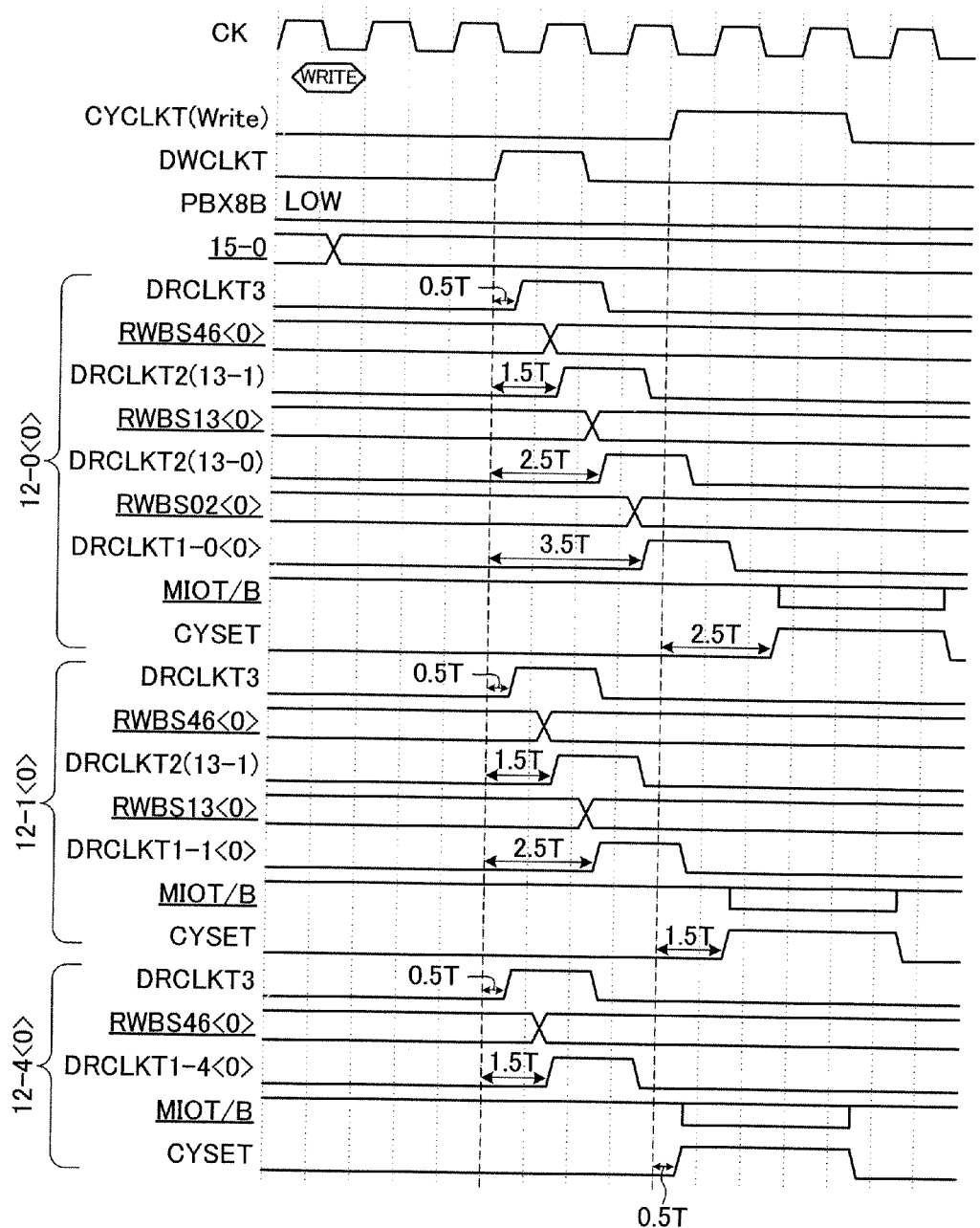
FIG. 13 is a view indicative of an embodiment of a time chart of each signal when the writing in the ×8 operation (operation mode signal PBX8B=low) is performed with the banks 10-0, 10-1, and 10-4 shown in FIG. 3 as the access targets.

Turning to FIG. 13, three examples, which are a case of writing the data through the column switch 12-0<0>, a case of writing the data through the column switch 12-1<0>, and a case of writing the data through the column switch 12-4<0>, are illustrated.

As illustrated in FIG. 13, first, the write command WRITE is supplied from outside and this becomes a signal to start the writing. The write data DQ is supplied from outside to the data input/output terminal 15-0 almost simultaneously with the write command WRITE. The command decoder 64 waits for a predetermined clock period after the write command WRITE is input and thereafter activates the control signal DWCLKT. Then, the command decoder 64 further waits for a predetermined clock period and thereafter activates the control command CYCLKT (Write). The waiting periods also are set as the latency in advance in the command decoder 64.

When the control command CYCLKT (Write) is activated, the control circuit 20 sequentially activates various control signals related to the writing at timings in accordance with the delay amounts set in the delay circuits D2, D4, D6, and D8 illustrated in FIGS. 6, 7, and 9. Although the control signals related to the column switches 12-0<0>, 12-1<0>, and 12-4<0> are illustrated in FIG. 13, the control signal is actually similarly activated in other parts.

Table 2 illustrates the delay amounts set in the delay circuits D2, D4, D6, and D8 in an example in FIG. 13. In the table, the delay amount is indicated by the magnitude of the delay of the control signal CYSET with respect to the control command CYCLKT (Write) for the delay circuit D2 and the delay amounts are indicated by the magnitude of the delay of the corresponding control signal with respect to the control command DWCLKT for the delay circuits D4, D6, and D8.

TABLE 2

| TARGET CIRCUITS OF SETTING | | DELAY AMOUNTS |
|---|---|---|
| MA/YS CONTROL CIRCUITS 21-4, 21-6 | D2 | 0.5T |
| | D4 | 1.5T |
| MA/YS CONTROL CIRCUITS 21-1, 21-3, 21-5, 21-7 | D2 | 1.5T |
| | D4 | 2.5T |
| MA/YS CONTROL CIRCUITS 21-0, 21-2 | D2 | 2.5T |
| | D4 | 3.5T |
| INTERMEDIATE BUFFER CONTROL CIRCUIT 22-0 | D6 | 2.5T |
| INTERMEDIATE BUFFER CONTROL CIRCUIT 22-1, 22-2 | D6 | 1.5T |
| FIFO CONTROL CIRCUIT 23 | D8 | 0.5T |

Each delay amount indicated in Table 2 also is determined according to the delay time T of one stage of the intermediate buffer. Specifically, as the amount when the number of stages of the intermediate buffer is k, the delay amount obtained by adding k×T to that when the number of stages is 0 is set.

For example, two delay amounts related to the banks 10-0 and 10-2 in which k=2 (delay amounts 2.5T and 3.5T set in the delay circuits D2 and D4 of the MA/YS control circuits 21-0 and 21-2) are obtained by adding 2T to delay amounts related to the banks 10-4 and 10-6 in which k=0 (delay amounts 0.5T and 1.5T set in the delay circuits D2 and D4 of the MA/YS control circuits 21-4 and 21-6). Also, the delay amount related to the intermediate buffer 13-0 in which k=1 (delay amount 2.5T set in the delay circuit D6 of the intermediate buffer control circuit 22-0) is obtained by adding T to the delay amount related to the intermediate buffers 13-1 and 13-2 in which k=0 (delay amount 1.5T set in the delay circuit D6 of the intermediate buffer control circuits 22-1 and 22-2).

By setting the above-described delay amount in each of the delay circuits, the control signal CYSET is activated at a timing at which the write data DQ arrives at the main IO line MIOT/B in all the banks as illustrated in FIG. 13. Therefore, according to the semiconductor device 1 of this embodiment, it is possible to allow the column switch 12 to conduct at an appropriate timing in all the banks at the time of writing in the x8 operation.

Figure 14:
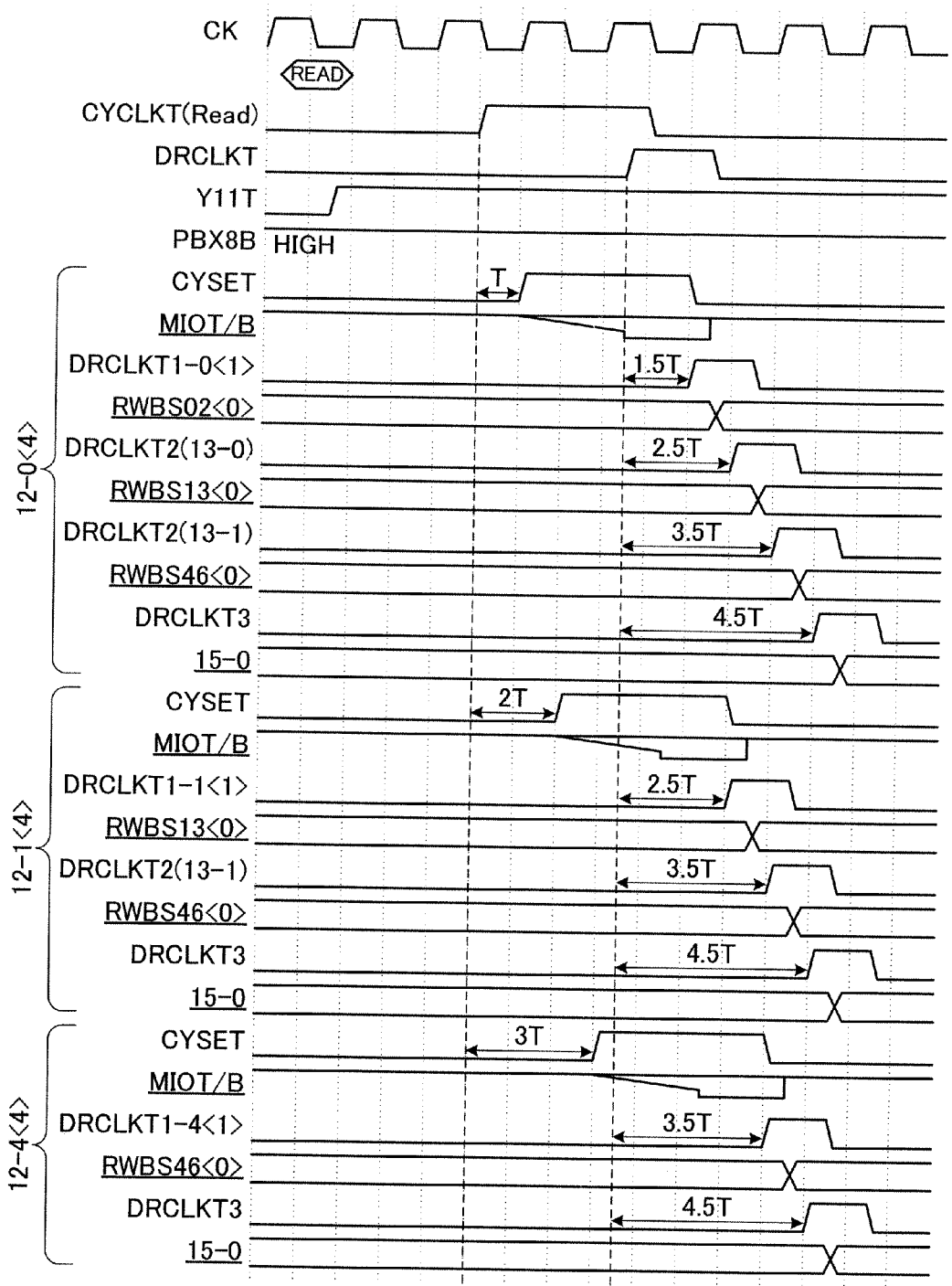
FIG. 14 is a view indicative of an embodiment of a time chart of each signal when the reading in the ×4 operation (operation mode signal PBX8B=high) is performed with the banks 10-0, 10-1, and 10-4 shown in FIG. 3 as the access target.

Turning to FIG. 14, three examples, which are a case of reading the data through the column switch 12-0<4>, a case of reading the data through the column switch 12-1<4>, and a case of reading the data through the column switch 12-4<4>, are illustrated. Also, a case in which the Y11 selection signal Y11T is high (when the Y11 address is "1") is illustrated.

In this case, not the control signal DRCLKT1<0> but the control signal DRCLKT1<1> is activated as illustrated in FIG. 14. As a result, for example, the read data DQ read through the column switch 12-0<4> is output not to the data input/output terminal 15-4 but to the data input/output terminal 15-0 through the read write bus RWBS46<0> and the like. The same applies also to another column switch.

On the other hand, the delay amount is the same as that of a case in the ×8 operation. By setting the delay amount of each delay circuit as in Table 1, it becomes possible to make the timing at which the read data DQ arrives at the data input/output terminal 15-0 constant irrespective of the bank as illustrated in FIG. 14.

Figure 15:
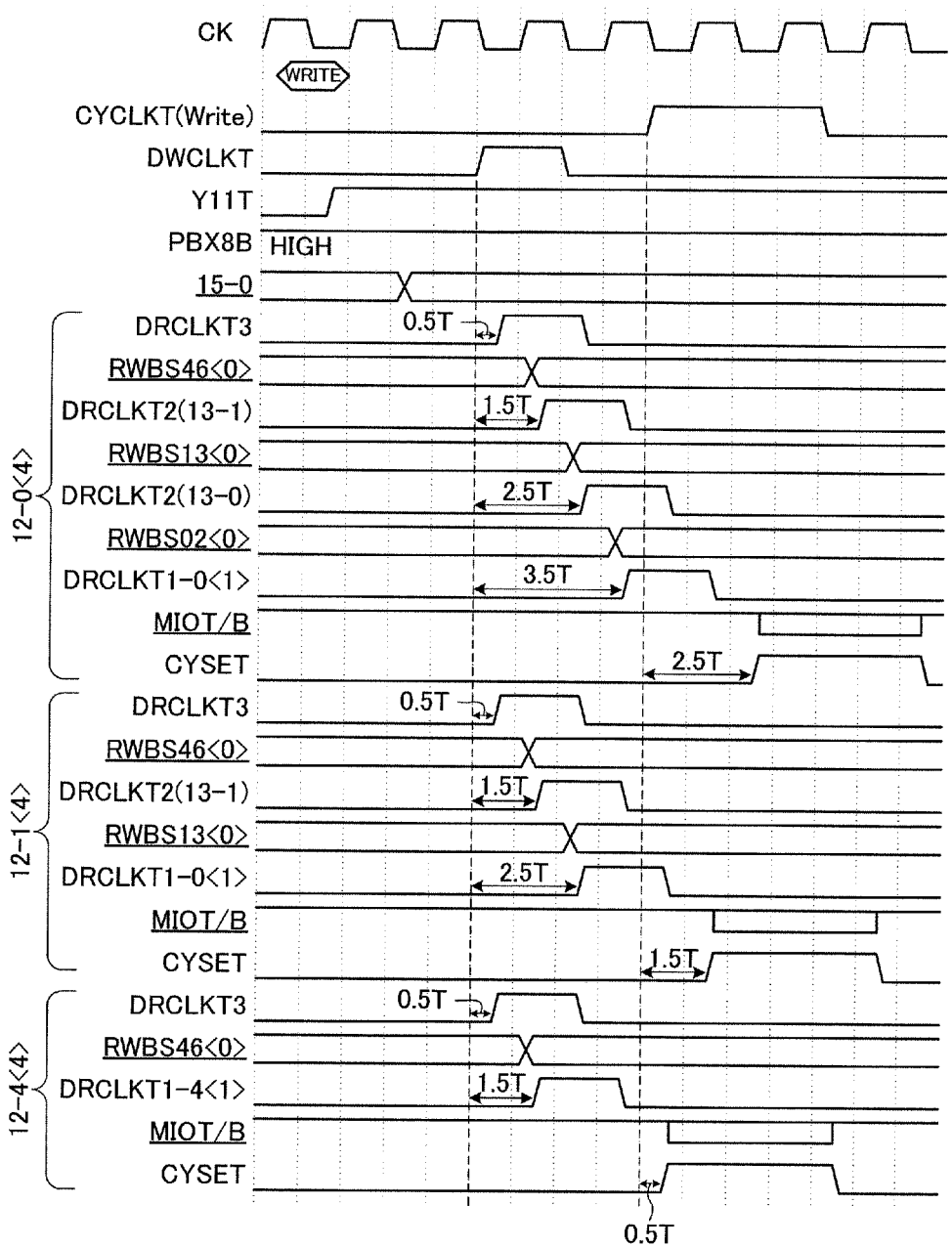
FIG. 15 is a view indicative of an embodiment of a time chart of each signal when the writing in the ×4 operation (operation mode signal PBX8B=high) is performed with the banks 10-0, 10-1, and 10-4 shown in FIG. 3 as the access target.

Turning to FIG. 15, three examples, which are a case of writing the data through the column switch 12-0<4>, a case of writing the data through the column switch 12-1<4>, and a case of writing the data through the column switch 12-4<4>, are illustrated. Also, a case in which the Y11 selection signal Y11T is high (when the Y11 address is "1") is illustrated.

In this case also, not the control signal DRCLKT1<0> but the control signal DRCLKT1<1> is activated as illustrated in FIG. 15. As a result, when the bank 10-0 is the access target, for example, the write data DQ input to the data input/output terminal 15-0 is written through the read/write bus RWBS46<0> and the like to the memory cell array 11-0 not through the column switch 12-0<0> but through the column switch 12-0<4>. The same applies also to a case in which another bank is the access target.

On the other hand, the delay amount is the same as that of a case in the ×8 operation. By setting the delay amount of each delay circuit as in Table 2, it is possible to allow the column switch 12 to conduct at an appropriate timing in all the banks as illustrated in FIG. 15.

As described above, according to the semiconductor device 1 of this embodiment, it is possible to adjust the arrival time of the read data DQ at the FIFO circuit 14 between the banks at the time of reading and to operate the column switch 12 at an appropriate time (arrival time of the write data DQ output from the FIFO circuit 14 to the corresponding column switch 12) for each bank at the time of writing while the number of stages of the intermediate buffer 13 is different for each bank. Therefore, the skew between the banks is inhibited even when the number of stages of the intermediate buffer is different for each bank, and it becomes possible to realize the high-speed operation. The technical idea of the present invention and the disclosure of the invention in detail produce a maximum effect at the time of so-called interleave operation to output corresponding data from a plurality of banks to the RWBS in chronological order. The same applies also to the interleave at the time of writing.

Also, in the semiconductor device 1 according to this embodiment, the Y11 multiplexer 16 is provided in the main amplifier circuit 84 (in the bank 10) as illustrated in FIG. 5 and the like. Therefore, since it is not required to arrange the Y11 multiplexer in the wiring area, reduction of the wiring area is realized.

It is apparent that the present invention is not limited to the above embodiments, but may be modified and changed without departing from the scope and spirit of the invention.

For example, although the delay amount of the delay circuit D1 of the MA/YS control circuits 21-0 and 21-2 illustrated in Table 1 is made a base delay amount T, in place of this, it is also possible to make the delay amount of the delay circuit D1 of the MA/YS control circuits 21-0 and 21-2 the base delay amount T and obtain the delay amount of the delay circuit D1 corresponding to another bank by adding or subtracting.

For example, a circuit form in each circuit block and the circuit generating another control signal disclosed in the drawings is not limited to the circuit form disclosed in the embodiment.

The technical concept of the present invention may be applied to various semiconductor devices. For example, the present invention may be applied to semiconductor products in general, including functions as CPUs (Central Processing Units), MCUs (Micro Control Units), DSPs (Digital Signal Processors), ASICs (Application Specific Integrated Circuits), ASSPs (Application Specific Standard Products), and memories. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A semiconductor device comprising:

first and second banks arranged so as to be opposed to each other in a first direction;

third and fourth banks arranged so as to be adjacent to the first and second banks, respectively, in a second direction substantially perpendicular to the first direction, the third and fourth banks being arranged so as to be opposed to each other in the first direction;

fifth and sixth banks arranged so as to be adjacent to the third and fourth banks, respectively, in the second direction, the third and fourth banks being sandwiched in between the first and second banks and the fifth and sixth banks, respectively, the fifth and sixth banks being arranged so as to be opposed to each other in the first direction;

first to sixth memory cell arrays provided in the first to sixth banks, respectively;

a first read/write bus connected to both of the first and second memory cell arrays, the first read/write bus extending in an area between the first and second banks in the second direction;

a second read/write bus connected to both of the third and fourth memory cell arrays, the second read/write bus extending in an area between the third and fourth banks in the second direction;

a third read/write bus connected to both of the fifth and sixth memory cell arrays, the third read/write bus extending in an area between the fifth and sixth banks in the second direction;

first and second column switches constituting a first group, the first and second column switches corresponding to the first and second memory cell arrays, respectively, each of the first and second column switches inputting and outputting a plurality of data stored in a plurality of memory cells in the corresponding memory cell array to and from the first read/write bus;

third and fourth column switches constituting a second group, the third and fourth column switches corresponding to the third and fourth memory cell arrays, respectively, each of the third and fourth column switches inputting and outputting a plurality of data stored in a plurality of memory cells in the corresponding memory cell array to and from the second read/write bus;

fifth and sixth column switches constituting a third group, the fifth and sixth column switches corresponding to the fifth and sixth memory cell arrays, respectively, each of the fifth and sixth column switches inputting and outputting a plurality of data stored in a plurality of memory cells in the corresponding memory cell array to and from the third read/write bus;

a first intermediate buffer connecting the first read/write bus and the second read/write bus;

a second intermediate buffer connecting the second read/write bus and the third read/write bus;

a first data input/output terminal being an interface with outside related to the data;

a first FIFO circuit inputting and outputting the data between the first read/write bus and the first data input/output terminal; and a control circuit generating a plurality of first control signals and a plurality of second control signals, the plurality of first control signals indicating timings at which the first to sixth column switches are allowed to electrically conduct during a read operation, the plurality of second control signals indicating timings at which the first to sixth column switches are allowed to electrically conduct during a write operation, wherein the control circuit activates the plurality of first control signals at different times in units of the first to third groups such that times indicating timings at which a plurality of read data read from the first to sixth memory cell arrays arrive at the first FIFO circuit are substantially the same in the first to sixth banks during a read operation, the control circuit activates the plurality of second control signals at different times in units of the first to third groups such that the first to sixth column switches are allowed to electrically conduct so as to substantially match timings at which the write data supplied from outside to the first data input/output terminal arrives at the corresponding column switch during a write operation, the control circuit stores a delay amount for each of the first to sixth banks determined based on the number of the first and second intermediate buffers provided on a data transmission path between the first FIFO circuit and each of the first to sixth banks for each of the read operation and the write operation, and the control circuit activates the plurality of first and second control signals based on the delay amount for each of the first to sixth banks.

2. The semiconductor device as claimed in claim 1, wherein the control circuit delays a first control command related to the read operation based on the delay amount for each of the first to sixth banks stored for the read operation, the control circuit generates the plurality of first control signals from the delayed first control command, the control circuit delays a second control command related to the write operation based on the delay amount for each of the first to sixth banks stored for the write operation, and the control circuit generates the plurality of second control signals from the delayed second control command.

3. The semiconductor device as claimed in claim 2, wherein the control circuit includes a plurality of first delay circuits and a plurality of second delay circuits, the delay amounts for the first to sixth banks related to the read operation are set in the plurality of first delay circuits, the delay amounts for the first to sixth banks related to the write operation are set in the plurality of second delay circuits, each of the plurality of first delay circuits outputs the delayed first control command in response to the delayed first control command, and each of the plurality of second delay circuits outputs the delayed second control command in response to the delayed second control command.

4. The semiconductor device as claimed in claim 1, further comprising first to sixth switch circuits corresponding to the first to sixth column switches, respectively, each of the first to sixth switch circuits being provided between the corresponding column switch and the corresponding one of the first to third read/write buses, wherein the control circuit generates a plurality of third control signals and a plurality of fourth control signals, the plurality of third control signals indicating timings at which the first to sixth switch circuits are allowed to electrically conduct during the read operation, the plurality of fourth control signals indicating timings at which the first to sixth switch circuits are allowed to electrically conduct during the write operation, the control circuit activates the plurality of third control signals at different times in units of the first to third groups such that the times indicating the timings at which the plurality of read data read from the first to sixth memory cell arrays arrive at the first FIFO circuit are substantially the same in the first to sixth banks, and the control circuit activates the plurality of fourth control signals at different times in units of the first to third groups such that the first to sixth switch circuits electrically conduct so as to substantially match the timings at which the write data supplied from outside to the first data input/output terminal arrives at the corresponding first to sixth switch circuits.

5. A semiconductor device comprising:

first and second banks arranged so as to be opposed to each other in a first direction;

third and fourth banks arranged so as to be adjacent to the first and second banks, respectively, in a second direction substantially perpendicular to the first direction, the third and fourth banks being arranged so as to be opposed to each other in the first direction;

fifth and sixth banks arranged so as to be adjacent to the third and fourth banks, respectively, in the second direction, the third and fourth banks being sandwiched in between the first and second banks and the fifth and sixth banks, respectively, the fifth and sixth banks being arranged so as to be opposed to each other in the first direction;

first to sixth memory cell arrays provided in the first to sixth banks, respectively;

a first read/write bus connected to both of the first and second memory cell arrays, the first read/write bus extending in an area between the first and second banks in the second direction;

a second read/write bus connected to both of the third and fourth memory cell arrays, the second read/write bus extending in an area between the third and fourth banks in the second direction;

a third read/write bus connected to both of the fifth and sixth memory cell arrays, the third read/write bus extending in an area between the fifth and sixth banks in the second direction;

first and second column switches constituting a first group, the first and second column switches corresponding to the first and second memory cell arrays, respectively, each of the first and second column switches inputting and outputting a plurality of data stored in a plurality of memory cells in the corresponding memory cell array to and from the first read/write bus;

third and fourth column switches constituting a second group, the third and fourth column switches corresponding to the third and fourth memory cell arrays, respectively, each of the third and fourth column switches inputting and outputting a plurality of data stored in a plurality of memory cells in the corresponding memory cell array to and from the second read/write bus;

fifth and sixth column switches constituting a third group, the fifth and sixth column switches corresponding to the fifth and sixth memory cell arrays, respectively, each of the fifth and sixth column switches inputting and outputting a plurality of data stored in a plurality of memory cells in the corresponding memory cell array to and from the third read/write bus;

a first intermediate buffer connecting the first read/write bus and the second read/write bus;

a second intermediate buffer connecting the second read/write bus and the third read/write bus;

a first data input/output terminal being an interface with outside related to the data;

a first FIFO circuit inputting and outputting the data between the first read/write bus and the first data input/output terminal; and a control circuit generating a plurality of first control signals and a plurality of second control signals, the plurality of first control signals indicating timings at which the first to sixth column switches are allowed to electrically conduct during a read operation, the plurality of second control signals indicating timings at which the first to sixth column switches are allowed to electrically conduct during a write operation, wherein the control circuit activates the plurality of first control signals at different times in units of the first to third groups such that times indicating timings at which a plurality of read data read from the first to sixth memory cell arrays arrive at the first FIFO circuit are substantially the same in the first to sixth banks during a read operation, the control circuit activates the plurality of second control signals at different times in units of the first to third groups such that the first to sixth column switches are allowed to electrically conduct so as to substantially match timings at which the write data supplied from outside to the first data input/output terminal arrives at the corresponding column switch during a write operation, and the semiconductor device further comprises:

a fourth read/write bus connected to both of the first and second memory cell arrays, the fourth read/write bus extending in the area between the first and second banks in the second direction;

a fifth read/write bus connected to both of the third and fourth memory cell arrays, the fifth read/write bus extending in the area between the third and fourth banks in the second direction;

a sixth read/write bus connected to both of the fifth and sixth memory cell arrays, the sixth read/write bus extending in the area between the fifth and sixth banks in the second direction;

a seventh column switch inputting and outputting the plurality of data stored in the plurality of memory cells in the first memory cell array to and from the first or fourth read/write bus;

an eighth column switch inputting and outputting the plurality of data stored in the plurality of memory cells in the second memory cell array to and from the first or fourth read/write bus;

a ninth column switch inputting and outputting the plurality of data stored in the plurality of memory cells in the third memory cell array to and from the second or fifth read/write bus;

a tenth column switch inputting and outputting the plurality of data stored in the plurality of memory cells in the fourth memory cell array to and from the second or fifth read/write bus;

an eleventh column switch inputting and outputting the plurality of data stored in the plurality of memory cells in the fifth memory cell array to and from the third or sixth read/write bus;

a twelfth column switch inputting and outputting the plurality of data stored in the plurality of memory cells in the sixth memory cell array to and from the third or sixth read/write bus;

a third intermediate buffer connecting the fourth read/write bus and the fifth read/write bus;

a fourth intermediate buffer connecting the fifth read/write bus and the sixth read/write bus;

a second data input/output terminal being an interface with outside related to the data;

a second FIFO circuit inputting and outputting the data between the fourth read/write bus and the second data input/output terminal; and first to sixth multiplexers corresponding to the seventh to twelfth column switches, respectively, each of the first to sixth multiplexers being provided between the corresponding column switch and two read/write buses out of the first to sixth read/write buses corresponding to the corresponding column switch, wherein:

a timing at which the seventh column switch electrically conduct is controlled by at least one of the plurality of first control signals and at least one of the plurality of second control signals related to the first column switch in the same bank, a timing at which the eighth column switch electrically conduct is controlled by at least one of the plurality of first control signals and at least one of the plurality of second control signals related to the second column switch in the same bank, a timing at which the ninth column switch electrically conduct is controlled by at least one of the plurality of first control signals and at least one of the plurality of second control signals related to the third column switch in the same bank, a timing at which the tenth column switch electrically conduct is controlled by at least one of the plurality of first control signals and at least one of the plurality of second control signals related to the fourth column switch in the same bank, a timing at which the eleventh column switch electrically conduct is controlled by at least one of the plurality of first control signals and at least one of the plurality of second control signals related to the fifth column switch in the same bank, a timing at which the twelfth column switch electrically conduct is controlled by at least one of the plurality of first control signals and at least one of the plurality of second control signals related to the sixth column switch in the same bank, the first to sixth multiplexers operate in either of a first operation mode or a second operation mode, the first to sixth multiplexers connecting the corresponding one of the seventh to twelfth column switches to the corresponding one of the fourth to sixth read/write buses in the first operation mode, the first to sixth multiplexers connecting the corresponding one of the seventh to twelfth column switches to the corresponding one of the first to third read/write buses in the second operation mode, the control circuit further generates a plurality of fifth control signals indicating timings at which the first to sixth multiplexers are allowed to electrically conduct at the read operation, the control circuit further generates a plurality of sixth control signals indicating timings at which the first to sixth multiplexers are allowed to electrically conduct at the write operation, the control circuit further activates the plurality of fifth control signals at different times in units of the first to third groups such that times indicating timings at which a plurality of read data read from the first to sixth memory cell arrays arrive at the first and second FIFO circuits are substantially the same in the first to sixth banks during the read operation, and the control circuit further activates the plurality of sixth control signals at different times in units of the first to third groups such that the first to sixth multiplexers electrically conduct so as to substantially match timings at which a plurality of write data supplied from outside to the first and second data input/output terminals arrive at the corresponding first to sixth multiplexers during the write operation.

6. The semiconductor device as claimed in claim 5, wherein the first to sixth multiplexers are provided in the first to sixth banks, respectively.

7. The semiconductor device as claimed in claim 1, wherein the control circuit further generates a plurality of seventh control signals indicating timings at which the first and second intermediate buffers are allowed to electrically conduct during the read operation, the control circuit further generates a plurality of eighth control signals indicating timings at which the first and second intermediate buffers are allowed to electrically conduct during the write operation, the control circuit further activates the plurality of seventh control signals at different times in units of the first to third groups such that the times indicating the timings at which a plurality of read data read from the first to sixth memory cell arrays arrive at the first FIFO circuit are substantially the same in the first to sixth banks during the read operation, and the control circuit further activates the plurality of eighth control signals at different times in units of the first to third groups such that the first and second intermediate buffers electrically conduct so as to substantially match timings at which the write data supplied from outside to the first data input/output terminal arrives at the corresponding first and second intermediate buffers during the write operation.

8. The semiconductor device as claimed in claim 5, wherein the control circuit further generates a plurality of seventh control signals indicating timings at which the first to fourth intermediate buffers are allowed to electrically conduct during the read operation, the control circuit further generates a plurality of eighth control signals indicating timings at which the first to fourth intermediate buffers are allowed to electrically conduct during the write operation, the control circuit further activates the plurality of seventh control signals at different times in units of the first to third groups such that the times indicating the timings at which a plurality of read data read from the first to sixth memory cell arrays arrive at the first and second FIFO circuits are substantially the same in the first to sixth banks during the read operation, and the control circuit further activates the plurality of eighth control signals at different times in units of the first to third groups such that the first to fourth intermediate buffers electrically conduct so as to substantially match timings at which a plurality of write data supplied from outside to the first and second data input/output terminals arrive at the corresponding first to fourth intermediate buffers during the write operation.

9. The semiconductor device as claimed in claim 1, further comprising first to sixth switch circuits corresponding to the first to sixth column switches, respectively, each of the first to sixth switch circuits being provided between the corresponding column switch and the corresponding one of the first to third read/write buses, wherein the control circuit generates a plurality of third control signals and a plurality of fourth control signals, the plurality of third control signals indicating timings at which the first to sixth switch circuits are allowed to electrically conduct during the read operation, the plurality of fourth control signals indicating timings at which the first to sixth switch circuits are allowed to electrically conduct during the write operation, the control circuit activates the plurality of third control signals at different times in units of the first to third groups such that the times indicating the timings at which the plurality of read data read from the first to sixth memory cell arrays arrive at the first FIFO circuit are substantially the same in the first to sixth banks, and the control circuit activates the plurality of fourth control signals at different times in units of the first to third groups such that the first to sixth switch circuits electrically conduct so as to substantially match the timings at which the write data supplied from outside to the first data input/output terminal arrives at the corresponding first to sixth switch circuits.

10. The semiconductor device as claimed in claim 2, further comprising first to sixth switch circuits corresponding to the first to sixth column switches, respectively, each of the first to sixth switch circuits being provided between the corresponding column switch and the corresponding one of the first to third read/write buses, wherein the control circuit generates a plurality of third control signals and a plurality of fourth control signals, the plurality of third control signals indicating timings at which the first to sixth switch circuits are allowed to electrically conduct during the read operation, the plurality of fourth control signals indicating timings at which the first to sixth switch circuits are allowed to electrically conduct during the write operation, the control circuit activates the plurality of third control signals at different times in units of the first to third groups such that the times indicating the timings at which the plurality of read data read from the first to sixth memory cell arrays arrive at the first FIFO circuit are substantially the same in the first to sixth banks, and the control circuit activates the plurality of fourth control signals at different times in units of the first to third groups such that the first to sixth switch circuits electrically conduct so as to substantially match the timings at which the write data supplied from outside to the first data input/output terminal arrives at the corresponding first to sixth switch circuits.

11. The semiconductor device as claimed in claim 3, further comprising first to sixth switch circuits corresponding to the first to sixth column switches, respectively, each of the first to sixth switch circuits being provided between the corresponding column switch and the corresponding one of the first to third read/write buses, wherein the control circuit generates a plurality of third control signals and a plurality of fourth control signals, the plurality of third control signals indicating timings at which the first to sixth switch circuits are allowed to electrically conduct during the read operation, the plurality of fourth control signals indicating timings at which the first to sixth switch circuits are allowed to electrically conduct during the write operation, the control circuit activates the plurality of third control signals at different times in units of the first to third groups such that the times indicating the timings at which the plurality of read data read from the first to sixth memory cell arrays arrive at the first FIFO circuit are substantially the same in the first to sixth banks, and the control circuit activates the plurality of fourth control signals at different times in units of the first to third groups such that the first to sixth switch circuits electrically conduct so as to substantially match the timings at which the write data supplied from outside to the first data input/output terminal arrives at the corresponding first to sixth switch circuits.

12. The semiconductor device as claimed in claim 1, wherein the control circuit further generates a plurality of seventh control signals indicating timings at which the first and second intermediate buffers are allowed to electrically conduct during the read operation, the control circuit further generates a plurality of eighth control signals indicating timings at which the first and second intermediate buffers are allowed to electrically conduct during the write operation, the control circuit further activates the plurality of seventh control signals at different times in units of the first to third groups such that the times indicating the timings at which a plurality of read data read from the first to sixth memory cell arrays arrive at the first FIFO circuit are substantially the same in the first to sixth banks during the read operation, and the control circuit further activates the plurality of eighth control signals at different times in units of the first to third groups such that the first and second intermediate buffers electrically conduct so as to substantially match timings at which the write data supplied from outside to the first data input/output terminal arrives at the corresponding first and second intermediate buffers during the write operation.

13. The semiconductor device as claimed in claim 2, wherein the control circuit further generates a plurality of seventh control signals indicating timings at which the first and second intermediate buffers are allowed to electrically conduct during the read operation, the control circuit further generates a plurality of eighth control signals indicating timings at which the first and second intermediate buffers are allowed to electrically conduct during the write operation, the control circuit further activates the plurality of seventh control signals at different times in units of the first to third groups such that the times indicating the timings at which a plurality of read data read from the first to sixth memory cell arrays arrive at the first FIFO circuit are substantially the same in the first to sixth banks during the read operation, and the control circuit further activates the plurality of eighth control signals at different times in units of the first to third groups such that the first and second intermediate buffers electrically conduct so as to substantially match timings at which the write data supplied from outside to the first data input/output terminal arrives at the corresponding first and second intermediate buffers during the write operation.

14. The semiconductor device as claimed in claim 3, wherein the control circuit further generates a plurality of seventh control signals indicating timings at which the first and second intermediate buffers are allowed to electrically conduct during the read operation, the control circuit further generates a plurality of eighth control signals indicating timings at which the first and second intermediate buffers are allowed to electrically conduct during the write operation, the control circuit further activates the plurality of seventh control signals at different times in units of the first to third groups such that the times indicating the timings at which a plurality of read data read from the first to sixth memory cell arrays arrive at the first FIFO circuit are substantially the same in the first to sixth banks during the read operation, and the control circuit further activates the plurality of eighth control signals at different times in units of the first to third groups such that the first and second intermediate buffers electrically conduct so as to substantially match timings at which the write data supplied from outside to the first data input/output terminal arrives at the corresponding first and second intermediate buffers during the write operation.

15. The semiconductor device as claimed in claim 4, wherein the control circuit further generates a plurality of seventh control signals indicating timings at which the first and second intermediate buffers are allowed to electrically conduct during the read operation, the control circuit further generates a plurality of eighth control signals indicating timings at which the first and second intermediate buffers are allowed to electrically conduct during the write operation, the control circuit further activates the plurality of seventh control signals at different times in units of the first to third groups such that the times indicating the timings at which a plurality of read data read from the first to sixth memory cell arrays arrive at the first FIFO circuit are substantially the same in the first to sixth banks during the read operation, and the control circuit further activates the plurality of eighth control signals at different times in units of the first to third groups such that the first and second intermediate buffers electrically conduct so as to substantially match timings at which the write data supplied from outside to the first data input/output terminal arrives at the corresponding first and second intermediate buffers during the write operation.

16. A semiconductor device comprising:
a first read/write bus extending in a first direction;
a second read/write bus extending in the first direction;
a third read/write bus extending in the first direction;
a first intermediate buffer coupled between the first and second read/write buses;
a second intermediate buffer coupled between the second and third read/write buses;
a first memory bank provided along the first read/write bus and including a first memory circuit and a first switch circuit, the first memory circuit including a first memory cell array, and the first switch circuit being coupled between the first memory circuit and the first read/write bus and rendered conductive in response to a first control signal to enable a data transfer between the first memory circuit and the first read/write bus;
a second memory bank provided along the second read/write bus and including a second memory circuit and a second switch circuit, the second memory circuit including a second memory cell array, and the second switch circuit being coupled between the second memory circuit and the second read/write bus and rendered conductive in response to a second control signal to enable a data transfer between the second memory circuit and the second read/write bus;
a third memory bank provided along the third read/write bus and including a third memory circuit and a third switch circuit, the third memory circuit including a third memory cell array, and the third switch circuit being coupled between the third memory circuit and the third read/write bus and rendered conductive in response to a third control signal to enable a data transfer between the third memory circuit and the third read/write bus;
a FIFO circuit coupled to the third read/write bus; and
a control circuit configured to control data read and write operations on each of the first, second and third memory banks and comprising:
  a first timing circuit including a first delay circuit to produce the first control signal in response to a first delay amount set in the first delay circuit;
  a second timing circuit including a second delay circuit to produce the second control signal in response to a second delay amount set in the second delay circuit; and
  a third timing circuit including a third delay circuit to produce the third control signal in response to a third delay amount set in the third delay circuit; and
wherein the first, second and third delay amounts are different from each other, and
wherein the control circuit stores the first, second and third delay amounts which are determined based on the number of the first and second intermediate buffers provided on a data transmission path between the FIFO circuit and each of the first, second and third banks for each of the read operation and the write operation.

17. The device as claimed in claim 16, wherein:
the first delay amount comprises a first data read delay amount and a first data write delay amount;
the second delay amount comprises a second data read delay amount and a second data write delay amount;
the third delay amount comprises a third data read delay amount and a third data write delay amount;
the first data read delay amount is less than the second data read delay amount and the second data read delay amount is less than the third data read amount; and
the first data write delay amount is greater than the second data write delay amount and the second data write delay amount is greater than the third data write delay amount.

18. The device as claimed in claim 17, further comprising:
a fourth memory bank provided along the first read/write bus and including a fourth memory circuit and a fourth switch circuit, the fourth memory circuit including a fourth memory cell array, the fourth switch circuit being coupled between the fourth memory circuit and the first read/write bus and rendered conductive in response to a fourth control signal to enable a data transfer between the fourth memory circuit and the first read/write bus, and the first and fourth memory banks being arranged in a second direction, that crosses the first direction, to sandwich the first read/write bus therebetween;
a fifth memory bank provided along the second read/write bus and including a fifth memory circuit and a fifth switch circuit, the fifth memory circuit including a fifth memory cell array, the fifth switch circuit being coupled between the fifth memory circuit and the second read/write bus and rendered conductive in response to a fifth control signal to enable a data transfer between the fifth memory circuit and the second read/write bus, and the second and fifth memory banks being arranged in the second direction to sandwich the second read/write bus therebetween; and
a sixth memory bank provided along the third read/write bus and including a sixth memory circuit and a sixth switch circuit, the sixth memory circuit including a sixth memory cell array, the sixth switch circuit being coupled between the sixth memory circuit and the third read/write bus and rendered conductive in response to a sixth control signal to enable a data transfer between the sixth memory circuit and the third read/write bus, and the third and sixth memory banks being arranged in the second direction to sandwich the third read/write bus therebetween,
wherein the control circuit is configured to control data read and write operations on each of the fourth, fifth and sixth memory banks and comprises:
  a fourth timing circuit including a fourth delay circuit to produce the fourth control signal in response to a fourth delay amount set in the fourth delay circuit;
  a fifth timing circuit including a fifth delay circuit to produce the fifth control signal in response to a fifth delay amount set in the fifth delay circuit; and
  a sixth timing circuit including a sixth delay circuit to produce the sixth control signal in response to a sixth delay amount set in the sixth delay circuit; and
wherein the fourth, fifth and sixth delay amounts are different from each other.

19. The device as claimed in claim 18, wherein:
the fourth delay amount comprises a fourth data read delay amount and a fourth data write delay amount;
the fifth delay amount comprises a fifth data read delay amount and a fifth data write delay amount;
the sixth delay amount comprises a sixth data read delay amount and a sixth data write delay amount;

the fourth data read delay amount is less than the fifth data read delay amount and the fifth data read delay amount is less than the sixth data read amount; and the fourth data write delay amount is greater than the fifth data write delay amount and the fifth data write delay amount is greater than the sixth data write delay amount.

\* \* \* \* \*